US010901827B2

(12) United States Patent
Schardt et al.

(10) Patent No.: US 10,901,827 B2
(45) Date of Patent: *Jan. 26, 2021

(54) FAILOVER OF A HARDWARE ACCELERATOR TO SOFTWARE

(71) Applicant: International Business Machines Corporation, Armonk, NY (US)

(72) Inventors: Paul E. Schardt, Rochester, MN (US); Jim C. Chen, Rochester, MN (US); Lance G. Thompson, Rochester, MN (US); James E. Carey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 333 days.

This patent is subject to a terminal disclaimer.

(21) Appl. No.: 15/979,405

(22) Filed: May 14, 2018

(65) Prior Publication Data
US 2019/0347152 A1    Nov. 14, 2019

(51) Int. Cl.
| G06F 11/00 | (2006.01) |
| G06F 11/07 | (2006.01) |
| G06F 11/30 | (2006.01) |
| G06F 9/451 | (2018.01) |
| G06F 9/448 | (2018.01) |

(52) U.S. Cl.
CPC .......... *G06F 11/0745* (2013.01); *G06F 9/448* (2018.02); *G06F 9/451* (2018.02); *G06F 11/3024* (2013.01)

(58) Field of Classification Search
CPC ........... G06F 2213/00; G06F 2209/509; G06T 15/005
See application file for complete search history.

(56) References Cited

U.S. PATENT DOCUMENTS

| 8,230,374 B2 | 7/2012 | McCubbrey |
| 8,838,674 B2 | 9/2014 | D-Amora et al. |
| 8,910,153 B2 | 12/2014 | Gupta et al. |

(Continued)

OTHER PUBLICATIONS

Schardt et al., "Helping a Hardware Accelerator Using Software" U.S. Appl. No. 16/034,074, filed Jul. 12, 2018.

(Continued)

*Primary Examiner* — Bryce P Bonzo
*Assistant Examiner* — Jeison C Arcos
(74) *Attorney, Agent, or Firm* — Martin & Associates, LLC; Derek P. Martin

(57) ABSTRACT

An accelerator manager monitors hardware accelerators that are called by one or more computer programs. A virtual function table includes multiple entries, where each entry correlates a call from a computer program to a corresponding call to either a software library or a hardware accelerator. A call by the computer program to a function in the virtual function table results in the call being routed to either the software library or to a hardware accelerator depending on the contents of the corresponding entry in the virtual function table. The accelerator manager, in response to a detected failure in an accelerator, replaces one or more calls in the virtual function table to the failed accelerator with calls to the software library. The accelerator manager can then retry the call that caused the accelerator to fail, which will then be executed by the software library.

15 Claims, 23 Drawing Sheets

(56) References Cited

U.S. PATENT DOCUMENTS

| | | |
|---|---|---|
| 8,949,838 B2 | 2/2015 | Mital et al. |
| 9,710,254 B2 | 7/2017 | Albot et al. |
| 9,760,386 B2 | 9/2017 | Hollinger |
| 10,169,073 B2 | 1/2019 | Drysdale et al. |
| 10,387,343 B2 | 8/2019 | Ching et al. |
| 2009/0322764 A1* | 12/2009 | Saini ............... G06T 15/005 345/501 |
| 2014/0007098 A1* | 1/2014 | Stillwell, Jr. ....... G06F 9/45533 718/1 |
| 2016/0299858 A1* | 10/2016 | Ching ............... G06F 13/24 |
| 2019/0004738 A1 | 1/2019 | Wu et al. |
| 2019/0187966 A1* | 6/2019 | Carey ............... G06F 8/4441 |

OTHER PUBLICATIONS

Schardt et al., "Helping a Hardware Accelerator Using Software" U.S. Appl. No. 16/844,186, filed Arp. 9, 2020.
IBM, Appendix P—List of IBM Patents or Patent Applications Treated As Related, dated May 15, 2020.
IBM, Appendix P—List of IBM Patents or Patent Applications Treated As Related, dated Jan. 28, 2019.
U.S. Appl. No. 15/979,405, filed May 14, 2018.
U.S. Appl. No. 16/034,074, filed Jul. 12, 2018.

* cited by examiner

Accelerator Catalog 1000

| Name | Location | LRU | MRU | Error Rate | Dependencies | Capabilities | Latency | Other Characteristic(s) |
|---|---|---|---|---|---|---|---|---|
| Acc1 | <path> | <time> | <time> | X/100 runs | Acc2 | FP Unit | 1.0 us | Includes NW connection |
| ... | ... | ... | ... | ... | ... | ... | ... | ... |
| AccN | <path> | <time> | <time> | Y/100 runs | None | Graphics | 500 ns | Affinity to Acc5 |

FIG. 10

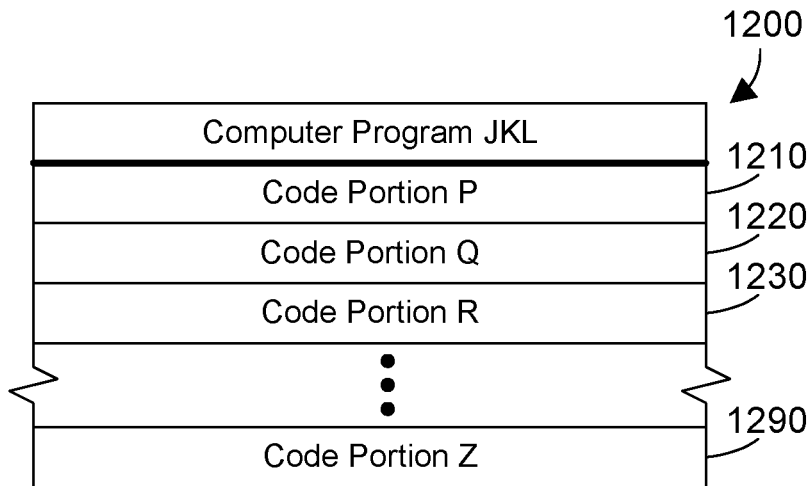
FIG. 12
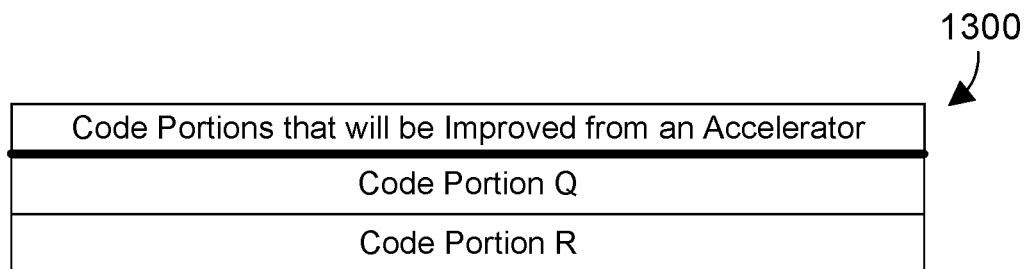
FIG. 13
| Accelerator Catalog | | | | | |
|---|---|---|---|---|---|
| Name | Location | LRU | MRU | Error Rate | Dependencies |
| AccQ | <path> | <time> | <time> | X/100 runs | None |
FIG. 14

| Accelerator Catalog |||||| 
|---|---|---|---|---|---|
| Name | Location | LRU | MRU | Error Rate | Dependencies |
| AccQ | <path> | <time> | <time> | X/100 runs | None |
| AccR | <path> | <time> | <time> | X/100 runs | None |

2600

| Virtual Function Table ||
|---|---|
| Call From Computer Program | Call To |
| F1 | L1 |
| F2 | L2 |
| F3 | L3 |
| F4 | L4 |
| ⋮ | ⋮ |
| FN | LN |

Computer Program LMN
- 2720 — Code Portion D — Call F1
- 2722 — Code Portion E
- 2724 — Code Portion F — Call F4
- ⋮
- 2728 — Code Portion L — Call F2

| Accelerator Correlation Table ||
|---|---|
| Accelerator | Library Function |
| Acc1 | L4 |
| Acc2 | L1 |
| Acc3 | L2 |

FIG. 28

| Virtual Function Table | |
|---|---|
| Call From Computer Program | Call To |
| F1 | Acc2 |
| F2 | Acc3 |
| F3 | L3 |
| F4 | Acc1 |
| ⋮ | ⋮ |
| FN | LN |

| Virtual Function Table | |
|---|---|
| Call From Computer Program | Call To |
| F1 | Acc2 |
| F2 | Acc3 |
| F3 | Acc4 |
| F4 | Acc1 |
| ⋮ | ⋮ |
| FN | LN |

FAILOVER OF A HARDWARE ACCELERATOR TO SOFTWARE

BACKGROUND

1. Technical Field

This disclosure generally relates to computer systems, and more specifically relates to hardware accelerators in computer systems.

2. Background Art

The Open Coherent Accelerator Processor Interface (OpenCAPI) is a specification developed by a consortium of industry leaders. The OpenCAPI specification defines an interface that allows any processor to attach to coherent user-level accelerators and I/O devices. OpenCAPI provides a high bandwidth, low latency open interface design specification built to minimize the complexity of high-performance accelerator design. Capable of 25 gigabits (Gbits) per second per lane data rate, OpenCAPI outperforms the current peripheral component interconnect express (PCIe) specification which offers a maximum data transfer rate of 16 Gbits per second per lane. OpenCAPI provides a data-centric approach, putting the compute power closer to the data and removing inefficiencies in traditional system architectures to help eliminate system performance bottlenecks and improve system performance. A significant benefit of OpenCAPI is that virtual addresses for a processor can be shared and utilized in an OpenCAPI device, such as an accelerator, in the same manner as the processor. With the development of OpenCAPI, hardware accelerators may now be developed that include an OpenCAPI architected interface.

BRIEF SUMMARY

An accelerator manager monitors hardware accelerators that are called by one or more computer programs. A virtual function table includes multiple entries, where each entry correlates a call from a computer program to a corresponding call to either a software library or a hardware accelerator. A call by the computer program to a function in the virtual function table results in the call being routed to either the software library or to a hardware accelerator depending on the contents of the corresponding entry in the virtual function table. The accelerator manager, in response to a detected failure in an accelerator, replaces one or more calls in the virtual function table to the failed accelerator with calls to the software library. The accelerator manager can then retry the call that caused the accelerator to fail, which will then be executed by the software library.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

FIG. 10 is a block diagram showing a sample accelerator catalog;

FIG. 12 is a block diagram showing a second sample computer program with different code portions;

FIG. 13 is a block diagram identifying two code portions in the computer program in FIG. 12 that would benefit from an accelerator;

FIG. 14 is a block diagram showing a sample accelerator catalog that includes an accelerator that corresponds to code portion Q;

FIG. 26 shows a virtual function table that creates a level of indirection for calls from the computer program to the software library;

FIG. 27 is a block diagram of the computer program in FIG. 24 after the calls to the software library have been replaced with calls to the virtual function table;

FIG. 28 is a block diagram of an accelerator correlation table showing currently-implemented accelerators that correspond to functions in the software library;

DETAILED DESCRIPTION

Figure 1:
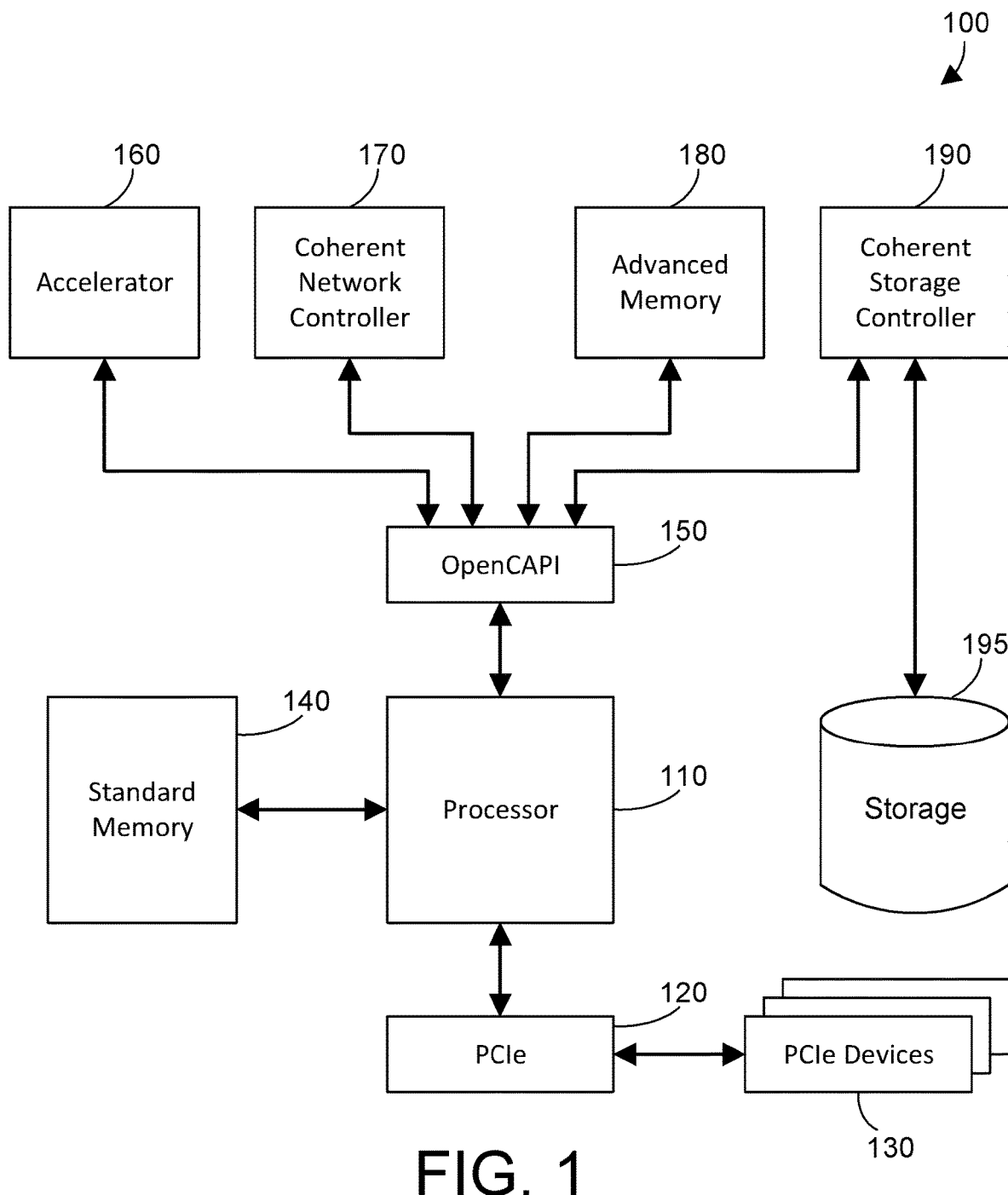
FIG. 1 is a block diagram of a sample system illustrating how an Open Coherent Accelerator Processor Interface (OpenCAPI) can be used.

As discussed in the Background Art section above, the Open Coherent Accelerator Processor Interface (OpenCAPI) is a specification that defines an interface that allows any processor to attach to coherent user-level accelerators and I/O devices. Referring to FIG. 1, a sample computer system 100 is shown to illustrate some of the concepts related to the OpenCAPI interface 150. A processor 110 is coupled to a standard memory 140 or memory hierarchy, as is known in the art. The processor is coupled via a PCIe interface 120 to one or more PCIe devices 130. The processor 110 is also coupled via an OpenCAPI interface 150 to one or more coherent devices, such as accelerator 160, coherent network controller 170, advanced memory 180, and coherent storage controller 190 that controls data stored in storage 195. While the OpenCAPI interface 150 is shown as a separate entity in FIG. 1 for purposes of illustration, instead of being a separate interface as shown in FIG. 1, the OpenCAPI interface 150 can be implemented within each of the coherent devices. Thus, accelerator 160 may have its own Open-CAPI interface, as may the other coherent devices 170, 180 and 190. One of the significant benefits of OpenCAPI is that virtual addresses for the processor 110 can be shared with coherent devices that are coupled to or include an Open-CAPI interface, permitting them to use the virtual addresses in the same manner as the processor 110.

Figure 2:
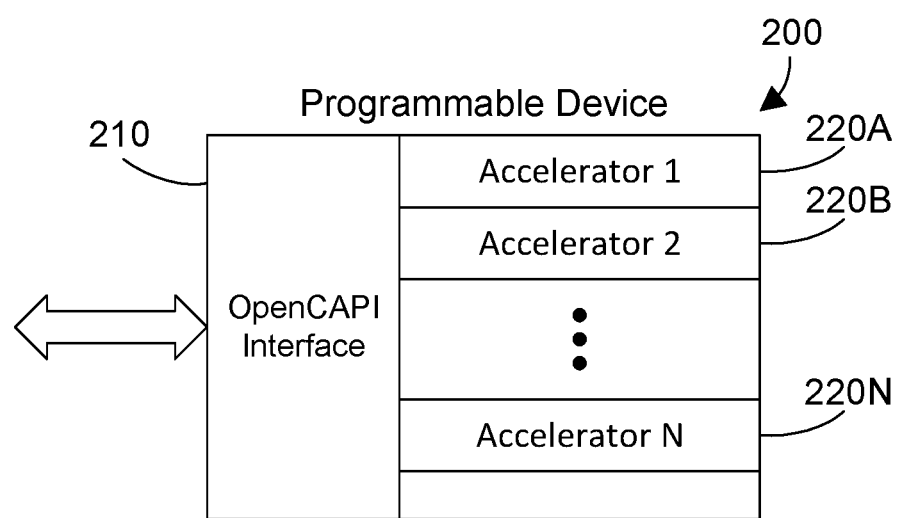
FIG. 2 is a flow diagram of a programmable device with an OpenCAPI interface that may include one or more hardware accelerators.

Referring to FIG. 2, a programmable device 200 represents any suitable programmable device. For example, the programmable device 200 could be an FPGA or an ASIC. An OpenCAPI interface 210 can be implemented within the programmable device. In addition, one or more accelerators can be implemented in the programmable device 200. FIG. 1 shows by way of example accelerator 1 220A, accelerator 2 220B, . . . , accelerator N 220N. In the prior art, a human designer would determine what type of accelerator is needed based on a function that needs to be accelerated by being implemented in hardware. The accelerator function could be represented, for example, in a hardware description language (HDL). Using known tools, the human designer can then generate an accelerator image that corresponds to the HDL. The accelerator image, once loaded into the programmable device such as 200 in FIG. 2, creates an accelerator in the programmable device that may be called as needed by one or more computer programs to provide the hardware accelerator(s).

An accelerator manager monitors hardware accelerators that are called by one or more computer programs. A virtual function table includes multiple entries, where each entry correlates a call from a computer program to a corresponding call to either a software library or a hardware accelerator. A call by the computer program to a function in the virtual function table results in the call being routed to either the software library or to a hardware accelerator depending on the contents of the corresponding entry in the virtual function table. The accelerator manager, in response to a detected failure in an accelerator, replaces one or more calls in the virtual function table to the failed accelerator with calls to the software library. The accelerator manager can then retry the call that caused the accelerator to fail, which will then be executed by the software library.

Figure 3:
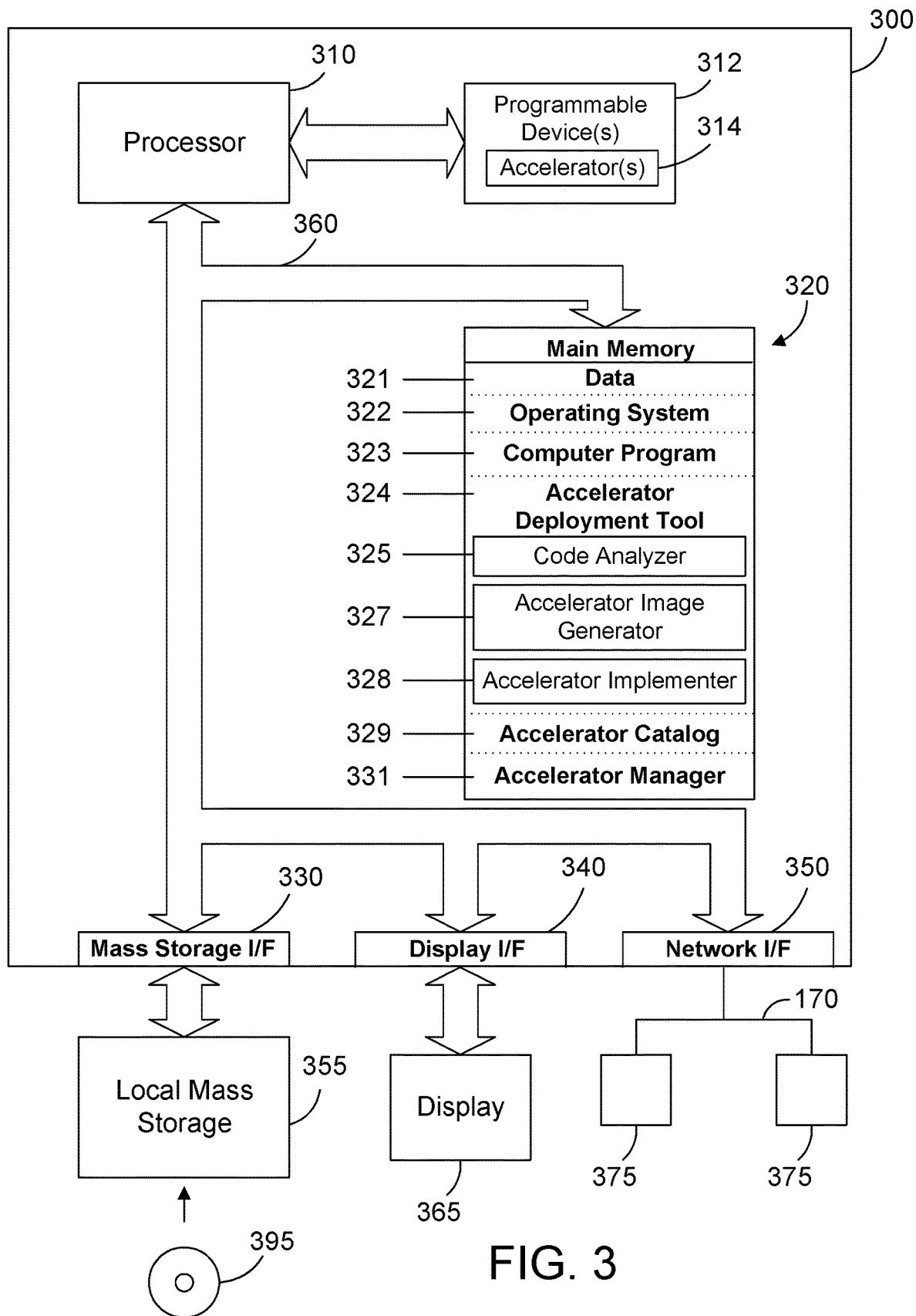
FIG. 3 is a block diagram of a computer system that includes a tool for managing accelerators.

Referring to FIG. 3, a computer system 300 is one suitable implementation of a computer system that includes an accelerator manager as described in more detail below. Server computer system 300 is an IBM POWER9 computer system. However, those skilled in the art will appreciate that the disclosure herein applies equally to any computer system, regardless of whether the computer system is a complicated multi-user computing apparatus, a single user workstation, a laptop computer system, a tablet computer, a phone, or an embedded control system. As shown in FIG. 3, computer system 300 comprises one or more processors 310, one or more programmable devices 312, a main memory 320, a mass storage interface 330, a display interface 340, and a network interface 350. These system components are interconnected through the use of a system bus 360. Mass storage interface 330 is used to connect mass storage devices, such as local mass storage device 355, to computer system 300. One specific type of local mass storage device 355 is a readable and writable CD-RW drive, which may store data to and read data from a CD-RW 395. Another suitable type of local mass storage device 355 is a card reader that receives a removable memory card, such as an SD card, and performs reads and writes to the removable memory. Yet another suitable type of local mass storage device 355 is universal serial bus (USB) that reads a storage device such a thumb drive.

Main memory 320 preferably contains data 321, an operating system 322, a computer program 323, an accelerator deployment tool 324, an accelerator catalog 329, and an accelerator manager 331. Data 321 represents any data that serves as input to or output from any program in computer system 300. Operating system 322 is a multitasking operating system, such as AIX or LINUX. Computer program 323 represents any suitable computer program, including without limitations an application program, an operating system, firmware, a device driver, etc. The accelerator deployment tool 324 preferably includes a code analyzer 325, an accelerator image generator 327, and an accelerator implementer 328. The code analyzer 325 analyzes the computer program 324 as it runs to determine its run-time performance. One suitable way for code analyzer 325 to analyze the computer program is using known techniques for monitoring the run-time performance of a computer program. For example, tools exist in the art that allow real-time monitoring of the run-time performance of a computer program using a monitor external to the computer program that detects, for example, which addresses are being executed by the processor 310 during the execution of the computer program 323. Other tools known as profilers allow inserting instrumentation code into a computer program, which is code that increments different counters when different branches of the computer program are executed. The values of the counters can be analyzed to determine the frequency of executing each portion of the computer program. The code analyzer 325, after analyzing the run-time performance of the computer program, identifies a code portion 326, which is a portion of code in the computer program 323, that will be improved from being deployed to a hardware accelerator to enhance the run-time performance of the computer program 323.

The accelerator image generator 327 dynamically generates an accelerator image corresponding to the code portion in the computer program 323 identified by the code analyzer 325. The code portion in the computer program 323 is shown as code portion 326 in FIGS. 4 and 5. The accelerator image generator 327 may generate an accelerator image from the code portion using any suitable method. For example, the accelerator image generator 327 could generate an equivalent hardware description language (HDL) representation of the code portion, then synthesize the HDL representation into a suitable accelerator image for the programmable device 312. The accelerator implementer 328 preferably takes an accelerator image generated by the accelerator image generator 327, and uses the accelerator image to program the programmable device 312, thereby generating a hardware accelerator 314 in a programmable device 312 that corresponds to the code portion.

In a first implementation, the accelerator deployment tool 324 dynamically generates an accelerator image corresponding to the code portion of the computer program 323, then programs the programmable device with the accelerator image so the programmable device includes a hardware accelerator that corresponds to the code portion. In a second implementation, an accelerator catalog 329 is provided and maintained. The accelerator catalog 329 preferably includes a listing of previously-generated accelerators. In the second implementation, the accelerator deployment tool 324 first checks the accelerator catalog 329 to see if a previously-generated accelerator is available for the code portion. If so, the accelerator deployment tool 324 deploys a previously generated accelerator image identified in the accelerator catalog. If not, the accelerator deployment tool 324 dynamically generates an accelerator image as described above, then loads the image into a programmable device 312 to provide the accelerator 314 that corresponds to the code portion.

Computer system 300 utilizes well known virtual addressing mechanisms that allow the programs of computer system 300 to behave as if they only have access to a large, contiguous address space instead of access to multiple, smaller storage entities such as main memory 320 and local mass storage device 355. Therefore, while data 321, operating system 322, computer program 323, accelerator deployment tool 324, accelerator catalog 329 and accelerator manager 331 are shown to reside in main memory 320, those skilled in the art will recognize that these items are not necessarily all completely contained in main memory 320 at the same time. It should also be noted that the term "memory" is used herein generically to refer to the entire virtual memory of computer system 300, and may include the virtual memory of other computer systems coupled to computer system 300.

Processor 310 may be constructed from one or more microprocessors and/or integrated circuits. Processor 310 could be, for example, one or more POWER9 microprocessors. Processor 310 executes program instructions stored in main memory 320. Main memory 320 stores programs and data that processor 310 may access. When computer system 300 starts up, processor 310 initially executes the program instructions that make up operating system 322. Processor 310 also executes the computer program 323, the accelerator deployment tool 324 and the accelerator manager 331.

Programmable device(s) 312 can be any suitable programmable logic device that can be dynamically programmed by the processor 310. Examples of known suitable programmable logic devices include field-programmable gate arrays (FPGAs). However, the programmable device 312 broadly includes any programmable logic device that allows the processor 310 to dynamically program the programmable device 312, including known technologies as well as technologies that are developed in the future.

Although computer system 300 is shown to contain only a single processor and a single system bus, those skilled in the art will appreciate that an accelerator manager as described herein may be practiced using a computer system that has multiple processors and/or multiple buses. In addition, the interfaces that are used preferably each include separate, fully programmed microprocessors that are used to off-load compute-intensive processing from processor 310. However, those skilled in the art will appreciate that these functions may be performed using I/O adapters as well.

Display interface 340 is used to directly connect one or more displays 365 to computer system 300. These displays 365, which may be non-intelligent (i.e., dumb) terminals or fully programmable workstations, are used to provide system administrators and users the ability to communicate with computer system 300. Note, however, that while display interface 340 is provided to support communication with one or more displays 365, computer system 300 does not necessarily require a display 365, because all needed interaction with users and other processes may occur via network interface 350.

Network interface 350 is used to connect computer system 300 to other computer systems or workstations 375 via network 370. Computer systems 375 represent computer systems that are connected to the computer system 300 via the network interface 350. Network interface 350 broadly represents any suitable way to interconnect electronic devices, regardless of whether the network 370 comprises present-day analog and/or digital techniques or via some networking mechanism of the future. Network interface 350 preferably includes a combination of hardware and software that allows communicating on the network 370. Software in the network interface 350 preferably includes a communication manager that manages communication with other computer systems 375 via network 370 using a suitable network protocol. Many different network protocols can be used to implement a network. These protocols are specialized computer programs that allow computers to communicate across a network. TCP/IP (Transmission Control Protocol/Internet Protocol) is an example of a suitable network protocol that may be used by the communication manager within the network interface 350. In one suitable implementation, the network interface 350 is a physical Ethernet adapter.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 4:
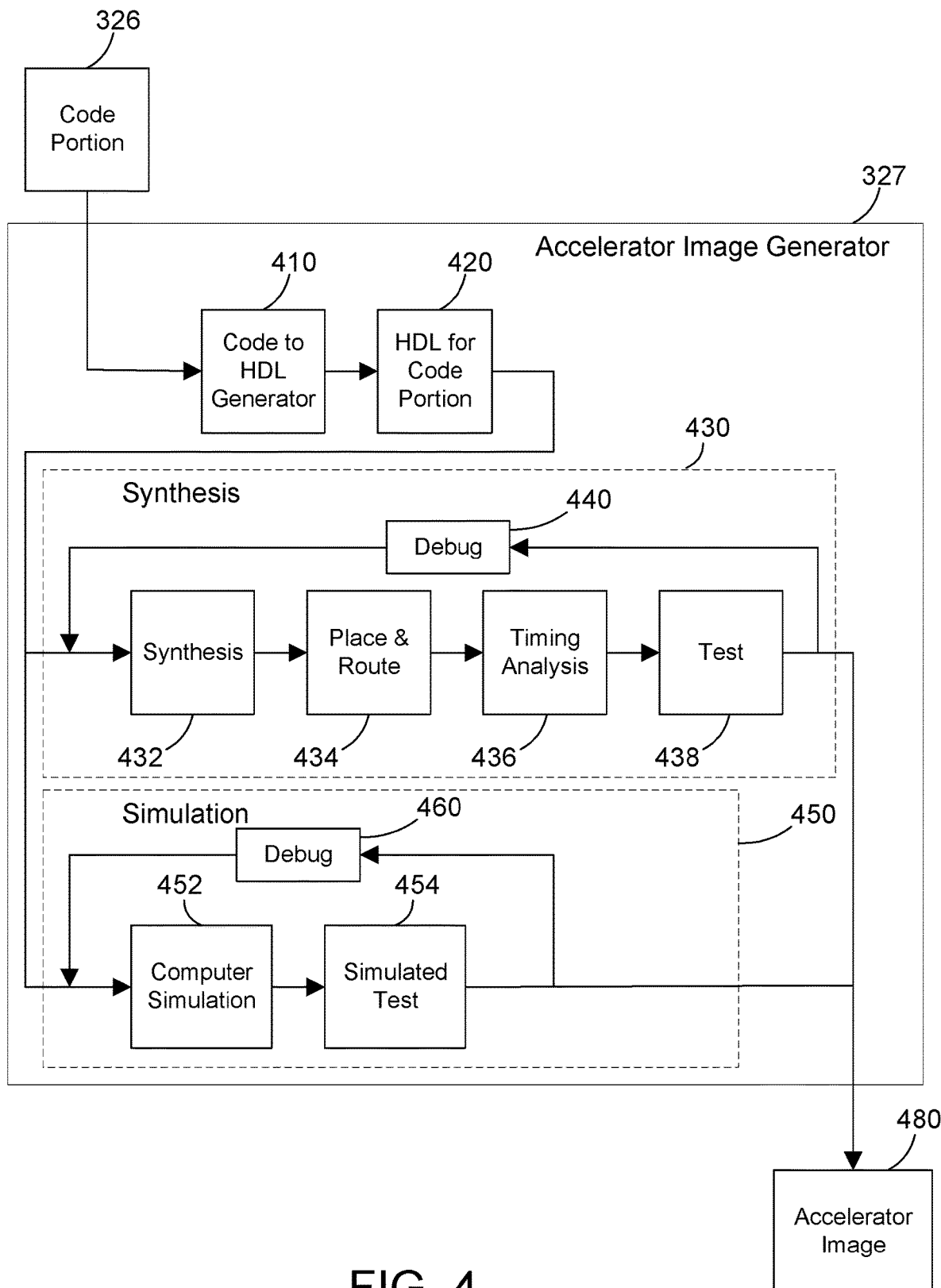
FIG. 4 is a flow diagram showing a specific implementation for how the accelerator image generator in FIG. 3 generates an accelerator image from a code portion.

FIG. 4 illustrates details of one suitable implementation of the accelerator image generator 327 shown in FIG. 3. The accelerator image generator 327 takes as input the code portion 326 shown in FIG. 4. A code to HDL generator 410 preferably converts the code portion 326 to a corresponding representation of the code portion in a hardware description language (HDL), shown in FIG. 4 as HDL for code portion 420. Known suitable hardware description languages include VHDL or Verilog, but any suitable hardware description language could be used. There are known software tools for generating an HDL representation of computer code. For example, Xilinx's Vivado High Level Synthesis is a software tool that converts code written in the C programming language to HDL. This type of tool is often referred to in the art as a "C to HDL" tool or a "C to RTL" tool, where RTL refers to the Register Transfer Level representation of a code portion needed to implement the code portion in hardware. The Code to HDL Generator 410 in FIG. 4 could be a known software tool, or could be a software tool specifically designed for the accelerator image generator 327.

The HDL for the code portion 420 is fed into one or more processes that may include both synthesis and simulation. The synthesis process 430 is shown in the middle portion of FIG. 4 in steps 432, 434, 436, 438 and 440. The simulation process 450 is shown in the lower portion of FIG. 4 in steps 452, 454 and 460. The HDL for code portion 420 may be fed into the synthesis block 432, which determines which hardware elements are needed. The place and route block 434 determines where on the programmable device to put the hardware elements, and how to route interconnections between those hardware elements. Timing analysis 436 analyzes the performance of the accelerator after the hardware elements have been placed and interconnections have been routed in block 434. Test block 438 runs tests on the resulting accelerator image to determine whether timing and performance parameters are satisfied. The test block 438 feeds back to debug block 440 when the design of the accelerator still needs improvement. This process may iterate several times.

The simulation process 450 takes in the HDL for the code portion 420, and performs a computer simulation to determine its functionality. A simulated test block 454 determines whether the simulated design functions as needed. The simulated test block 454 feeds back to a debug block 460 when the design of the accelerator still needs improvement.

The accelerator image generator 327 may include either the synthesis block 430, the simulation block 450, or both. In the most preferred implementation, the accelerator image generator 327 includes both the synthesis block 430 and the simulation block 450. The synthesis process can be very time-consuming. The simulation block is typically much faster in testing the design of the HDL than the synthesis block. When both synthesis 430 and simulation 450 are both present, the accelerator image generator can use both of these in any suitable way or combination. For example, the simulation block 450 could be used initially to iterate a few times on the design, and when the design is mostly complete, the mostly-completed design could be fed into the synthesis block 430. In another implementation, the synthesis and simulation blocks could function in parallel and cooperate until the generation of the accelerator image is complete.

Regardless of the specific process used, the accelerator image generator 327 generates for the code portion 326 an accelerator image 480 that corresponds to the code portion 326. Once the accelerator image 480 has been generated, the accelerator implementer 328 in FIG. 3 can load the accelerator image 480 into a programmable device 312 to produce an accelerator 314 corresponding to the code portion 326. The accelerator 314 in the programmable device 312 may then be called by the computer program in place of the code portion 326.

Figure 5:
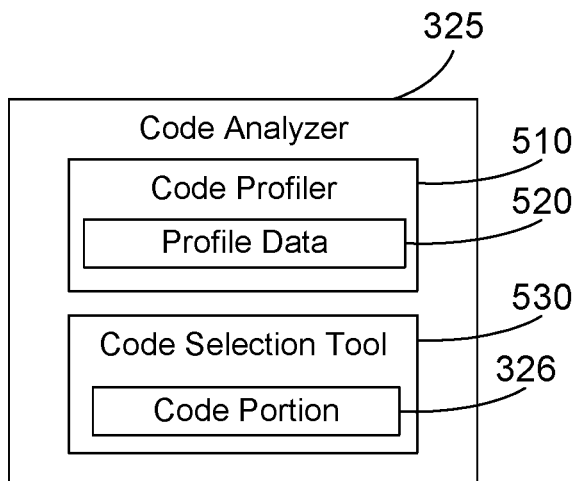
FIG. 5 is a block diagram of a specific implementation for the code analyzer in FIG. 3 that analyzes a computer program and selects a code portion.

Some details of one possible implementation for the code analyzer 325 in FIG. 3 are shown in FIG. 5. The code analyzer 325 can include a code profiler 510 that is used to profile the computer program. Profiling is done by the code profiler 510 preferably inserting instrumentation code into the computer program to generate profile data 520 as the computer program runs. The profile data 520 indicates many possible features of the computer program, including the frequency of executing different portions, the number or loop iterations, exceptions generated, data demand, bandwidth, time spent in a critical portion, etc. Software profilers are very well-known in the art, and are therefore not discussed in more detail here. For our purposes herein, suffice it to say the code profiler 510 generates profile data 520 that indicates run-time performance of the computer program being profiled.

The code analyzer 325 additionally includes a code selection tool 530 that identifies a code portion 326 that will be improved from being implemented in a hardware accelerator. Any suitable code portion could be identified according to any suitable criteria, algorithm or heuristic. For example, a portion of the code that performs floating-point calculations could be identified so that a corresponding floating-point accelerator could be generated to perform the floating-point calculations in the code. A portion of the code that performs a search of a database could be identified so a corresponding database search accelerator could be generated to replace the database search. A portion of the code that performs a specific function, such as data compression, XML parsing, packet snooping, financial risk calculations, etc., could also be identified. Of course, other code portions could be identified within the scope of the disclosure and claims herein. The code selection tool 530 can use any suitable criteria, algorithm or heuristic, whether currently known or developed in the future, to identify code portion 326. Once the code portion 326 in the computer program has been identified, a corresponding accelerator may be dynamically generated.

Figure 6:
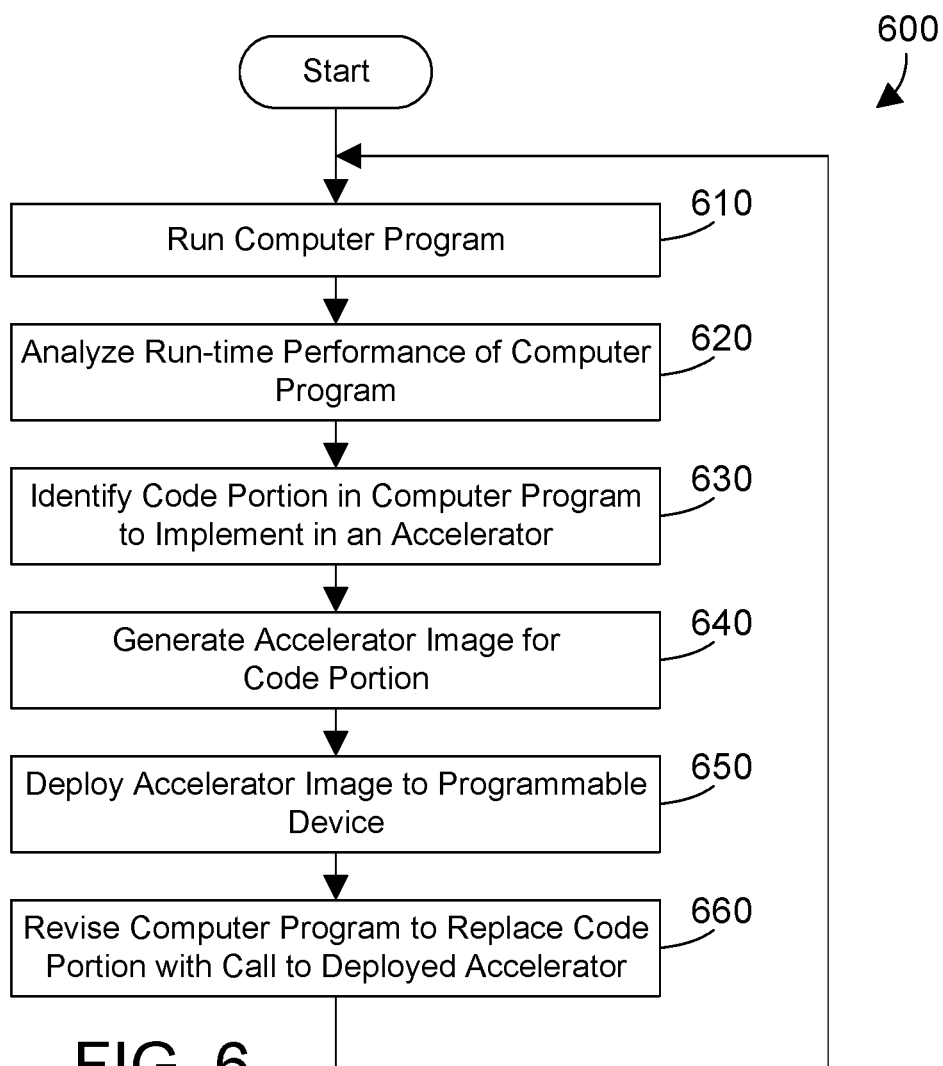
FIG. 6 is a flow diagram of a method for identifying a code portion in a computer program, dynamically generating and deploying an accelerator that corresponds to the code portion, then revising the computer program to replace the code portion with a call to the deployed accelerator.

Referring to FIG. 6, a method 600 starts by running the computer program (step 610). The run-time performance of the computer program is analyzed (step 620). This can be done, for example, by the code analyzer 325 shown in FIGS. 3 and 5 and discussed above. A code portion in the computer program is identified to implement in an accelerator (step 630). An accelerator image for the code portion is generated (step 640). The accelerator image is deployed to a programmable device (step 650). The computer program is then revised to replace the code portion with a call to the deployed accelerator (step 660). At this point, the deployed accelerator will perform the functions in hardware that were previously performed by the code portion, thereby improving the run-time performance of the computer program. Note that method 600 loops back to step 610 and continues, which means method 600 can iterate to continuously monitor the computer program and deploy accelerators, as needed, to improve performance of the computer program.

Figure 7:
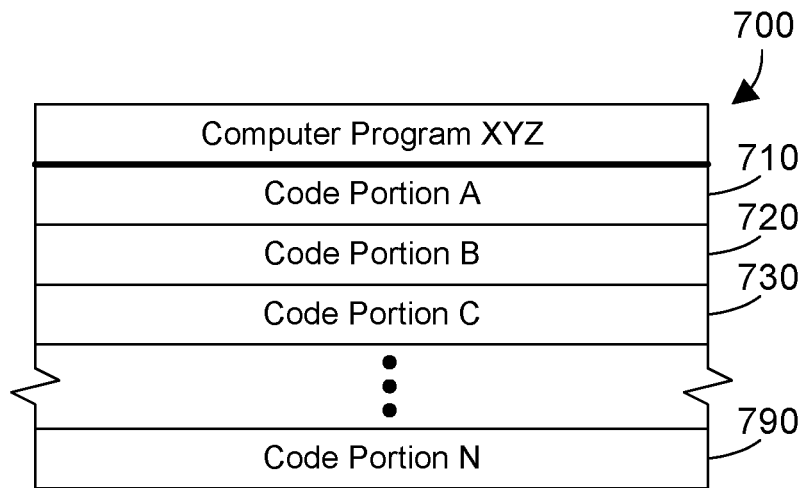
FIG. 7 is a block diagram showing a first sample computer program with different code portions.
Figure 8:
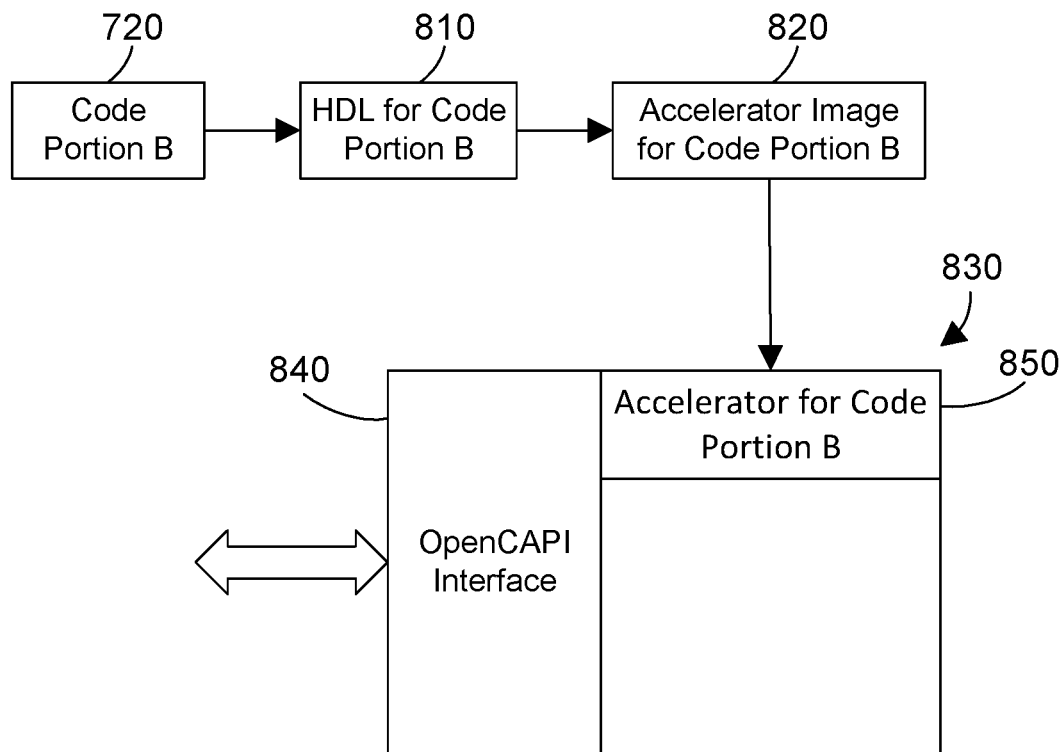
FIG. 8 is a block diagram showing how a code portion can be transformed to HDL, then to an accelerator image, which can be deployed to a programmable device to provide an accelerator.

Some examples are now provided to illustrate the concepts discussed above. FIG. 7 shows a sample computer program 700 that includes multiple code portions, shown in FIG. 7 as code portion A 710, code portion B 720, code portion C 730, . . . , code portion N 790. We assume code portion B 720 is identified as a code portion that will be improved from being implemented in a hardware accelerator. Code portion B 720 is then converted to a corresponding HDL representation 810, as shown in FIG. 8. The HDL for code portion B 810 is then used to generate an accelerator image for code portion B 820. This could be done, for example, using the method shown in FIG. 4, or using any other suitable method. Once the accelerator image for code portion B 820 has been generated, the accelerator image is loaded into a programmable device 830 to generate the accelerator for code portion B 850. Programmable device 830 is one suitable implementation for the programmable device 312 shown in FIG. 3, and preferably includes an OpenCAPI interface 840.

Figure 9:
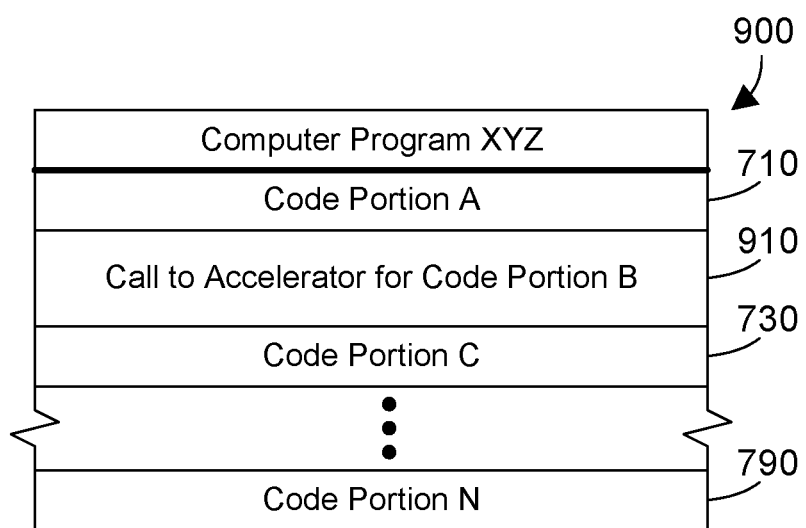
FIG. 9 is a block diagram showing the computer program in FIG. 7 after code portion B has been replaced with a call to the accelerator for code portion B.

Once the accelerator is deployed in the programmable device 830, the code portion B in the computer program is deleted and replaced by a call to the accelerator for code portion B 910 shown in FIG. 9. In the most preferred implementation, the accelerator for code portion B includes a return to the code that called it once the processing in the accelerator for code portion B is complete. In this manner the computer program 900, when it needs to execute what was previously code portion B, will make a call to the accelerator for code portion B, which will perform the needed functions in hardware, then return to the computer program. In this manner a suitable accelerator may be automatically generated for an identified code portion to increase the run-time performance of the computer program.

In a first implementation, an accelerator may be dynamically generated to improve the performance of a computer program, as shown in FIGS. 4-9 and described above. In a second implementation, once an accelerator is dynamically generated, it can be stored in a catalog so it may be reused when needed. FIG. 10 shows a sample accelerator catalog 1000, which is one suitable implementation for the accelerator catalog 329 shown in FIG. 3. An accelerator catalog may include any suitable data or information that may be needed for an accelerator or the corresponding code portion. For the specific example shown in FIG. 10, accelerator catalog includes each of the following fields: Name, Location, Least Recently Used (LRU), Most Recently Used (MRU), Dependencies, Capabilities, Latency, and Other Characteristics. The Name field preferably includes a name for the accelerator. The name field may also include a name for a code portion that corresponds to the accelerator. The location field preferably specifies a path that identifies the location for the accelerator image. While the accelerator image could be stored in the catalog 1000, in the most preferred implementation the catalog 1000 instead includes a path to storage external to the accelerator catalog 1000 where the accelerator image is stored. The least recently used (LRU) field could include the time when the accelerator was used the first time. In the alternative, the LRU field could include a flag that is set when the accelerator is the least recently used of all the accelerators in the catalog. The most recently used (MRU) field could include the time when the accelerator was last used. In the alternative, the MRU field could include a flag that is set when the accelerator is the most recently used of all the accelerators in the catalog. The error rate field provides a suitable error rate for the accelerator, and can be expressed in any suitable way. For the example in FIG. 10, the error rate is expressed as a number X of errors per 100 runs of the accelerator. The error rate field could include any suitable error information that could be, for example, dynamically monitored so an increase in the error rate could result in a notification to take corrective action. The dependencies field may indicate any dependencies the accelerator may have. For example, the dependencies field could specify the specific programmable device the accelerator was designed for. The dependencies field could also specify any dependencies on other accelerators. Thus, accelerator Acc1 in FIG. 10 has a dependency on Acc2, which means Acc1 needs Acc2 to also be implemented. The capabilities field can provide any suitable indication of the capabilities of the accelerator. In the two entries shown in FIG. 10, the capabilities are shown as floating point (FP) Unit for Acc1 and Graphics for AccN. Note, however, the capabilities can be indicated in any suitable way. For example, the capabilities could include a specification of the code portion for which the accelerator was implemented. A separate index could be maintained that correlates each code portion to its corresponding accelerator, along with a descriptor or other data that describes attributes of the code portion. The capabilities field could include any suitable information, such as a pointer to the index, so the code portion corresponding to the accelerator could be easily identified.

The latency field preferably specifies average latency for the accelerator. For the example shown in FIG. 10, Acc1 has a latency of 1.0 microseconds while accelerator AccN has a latency of 500 nanoseconds. Latency could represent, for example, the time required for the accelerator to perform its intended function. The other characteristics field can include any other suitable information or data that describes or otherwise identifies the accelerator, its characteristics and attributes, and the code portion corresponding to the accelerator. For the two sample entries in FIG. 10, the other characteristics field indicates Acc1 includes a network connection, and AccN has an affinity to Acc5, which means AccN should be placed in close proximity to Acc5 on the programmable device, if possible. The various fields in FIG. 10 are shown by way of example, and it is within the scope of the disclosure and claims herein to provide an accelerator catalog with any suitable information or data.

Figure 11:
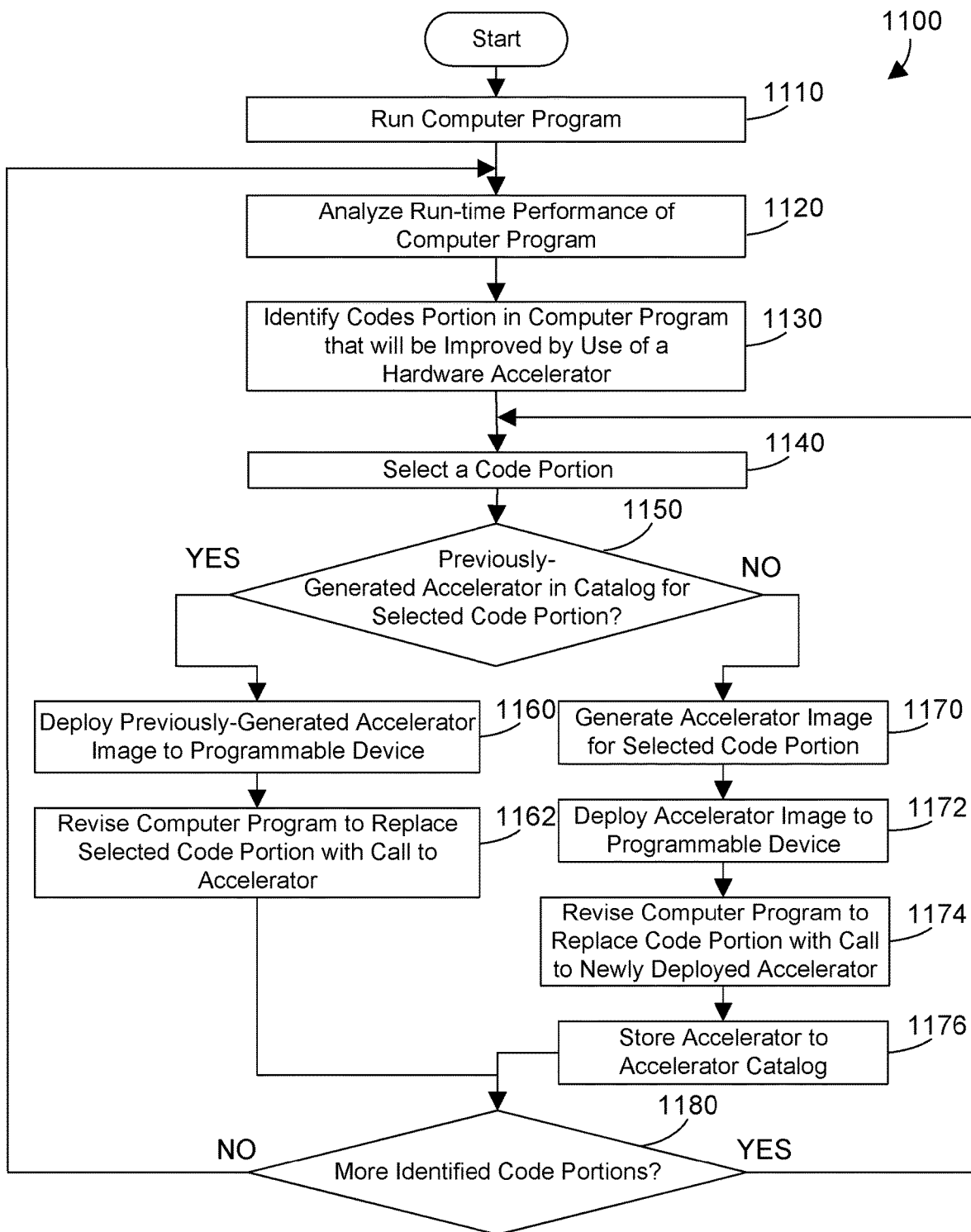
FIG. 11 is a flow diagram of a method for deploying an accelerator for a code portion when a catalog of previously-generated accelerators is maintained.

Referring to FIG. 11, a method 1100 in accordance with the second implementation begins by running the computer program (step 1110). The run-time performance of the computer program is analyzed (step 1120). One or more code portions in the computer program that will be improved by use of a hardware accelerator are identified (step 1130). One of the identified code portions is selected (step 1140). When there is a previously-generated accelerator in the accelerator catalog for the selected code portion (step 1150=YES), the previously-generated accelerator image is deployed to the programmable device (step 1160) to provide the accelerator. The computer program is then revised to replace the selected code portion with a call to the accelerator (step 1162). When there is no previously-generated accelerator in the catalog for the selected code portion (step 1150=NO), an accelerator image for the selected code portion is dynamically generated (step 1170), the accelerator image is deployed to a programmable device (step 1172), the computer program is revised to replace the code portion with a call to the newly deployed accelerator (step 1174), and the accelerator is stored to the accelerator catalog (step 1176). When the accelerator image is stored within the catalog entry, step 1176 write the accelerator image to the catalog. When the accelerator image is stored in storage external to the catalog, step 1176 stores the accelerator image to the external storage and writes an entry to the accelerator catalog that includes a path to the accelerator image in the external storage.

When there are more identified code portions (step 1180=YES), method 1100 loops back to step 1140 and continues. When there are no more identified code portions (step 1180=NO), method 1100 loops back to step 1120 and continues. This means method 1100 most preferably continuously monitors the computer program and dynamically generates and/or deploys accelerators as needed to improve the run-time performance of the computer program.

Figure 15:
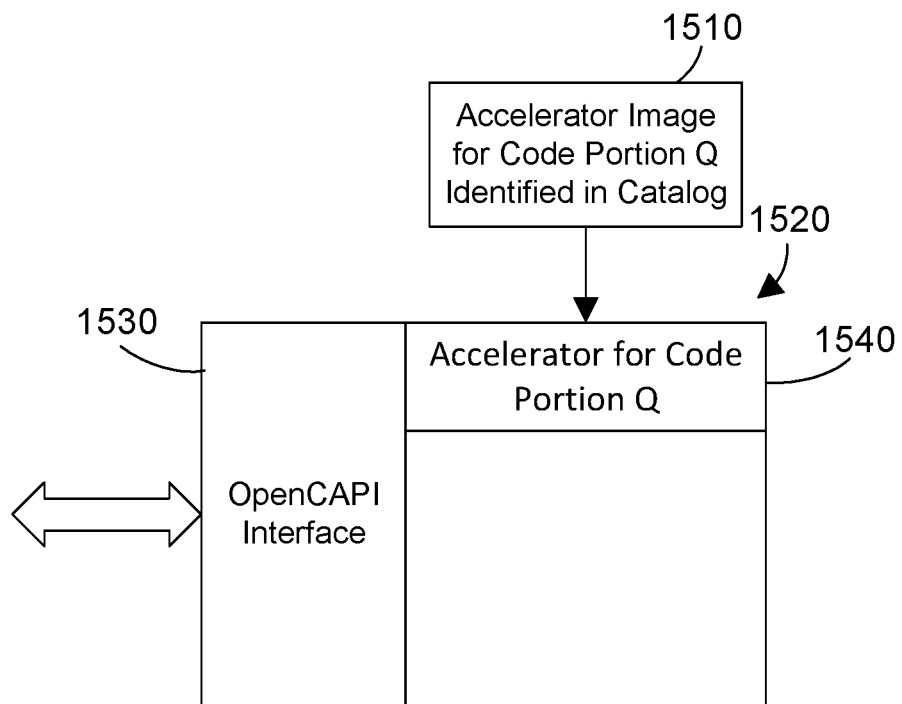
FIG. 15 is a block diagram showing the deployment of an accelerator image for code portion Q identified in the catalog in FIG. 14 to a programmable device.

An example is now provided to illustrate the concepts in FIG. 11 that relate to the second preferred implementation. FIG. 12 shows a sample computer program 1200 that includes many code portions, represented in FIG. 12 as code portion P 1210, code portion Q 1220, code portion R 1230, . . . , code portion Z 1290. We assume steps 1110, 1120 and 1130 in FIG. 11 are performed. In step 1130, we assume code portion Q 1220 and code portion R 1230 are identified as code portions that will be improved by implementing these code portions in an accelerator, as shown in table 1300 in FIG. 13. We further assume we have an accelerator catalog 1400 that is one suitable implementation for the accelerator catalog 329 shown in FIG. 3. Accelerator catalog 1400 has a single entry for AccQ, which we assume is an accelerator for code portion Q 1220 that was generated previously. Because the accelerator for code portion Q was previously-generated, the corresponding accelerator image can be used without having to generate the accelerator image anew. We assume code portion Q 1220 is selected in step 1140. There is a previously-generated accelerator in the catalog for code portion Q (step 1150=YES), so the previously-generated accelerator image corresponding to code portion Q 1510 is deployed to the programmable device (step 1160), as shown in FIG. 15. Deploying the accelerator image for code portion Q 1510 identified in the catalog to the programmable device 1520 results in implementing the accelerator for code portion Q 1540 in the programmable device 1520. The accelerator for code portion Q 1540 may then be called by the computer program to perform the functions of previous code portion Q in hardware, thereby increasing the run-time performance of the computer program. The programmable device 1520 is one suitable example of the programmable device 312 shown in FIG. 3, and preferably includes an OpenCAPI interface 1530.

Figure 16:
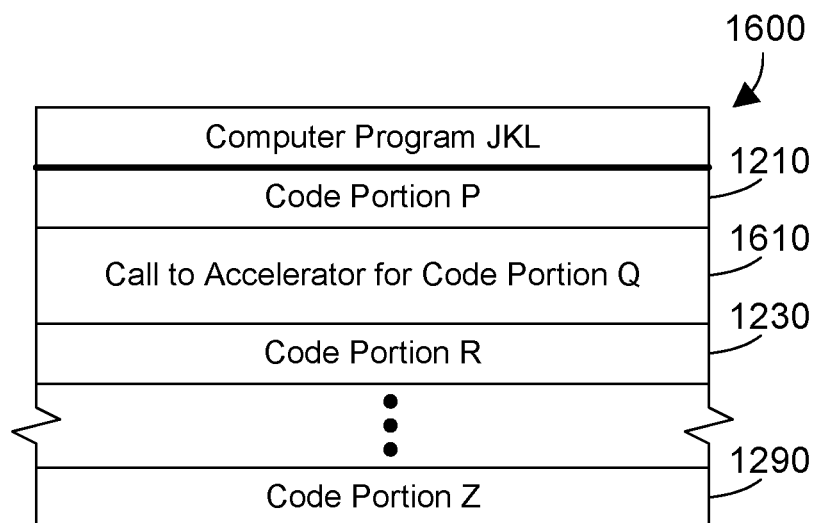
FIG. 16 is a block diagram showing the computer program in FIG. 12 after code portion Q has been replaced with a call to the accelerator for code portion Q.

The computer program is then revised to replace the selected code portion Q 1220 with a call to the accelerator for code portion Q (step 1162). FIG. 16 shows the computer program 1200 in FIG. 12 after the code portion Q has been replaced with the call to the accelerator for code portion Q, as shown at 1610 in FIG. 16. Thus, computer program 1600, instead of executing code portion Q, instead invokes the accelerator for code portion Q 1540 in the programmable device 1520 to increase the run-time performance of the computer program.

Figure 17:
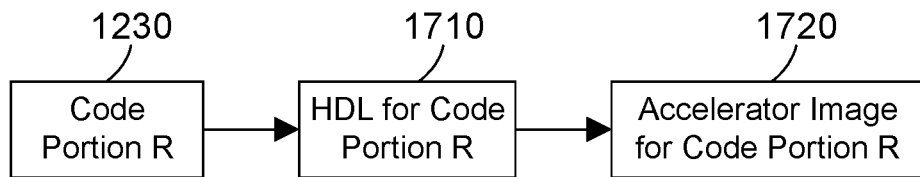
FIG. 17 is a block diagram showing generation of an accelerator image from code portion R in the computer program shown in FIGS. 12 and 16.
Figure 18:
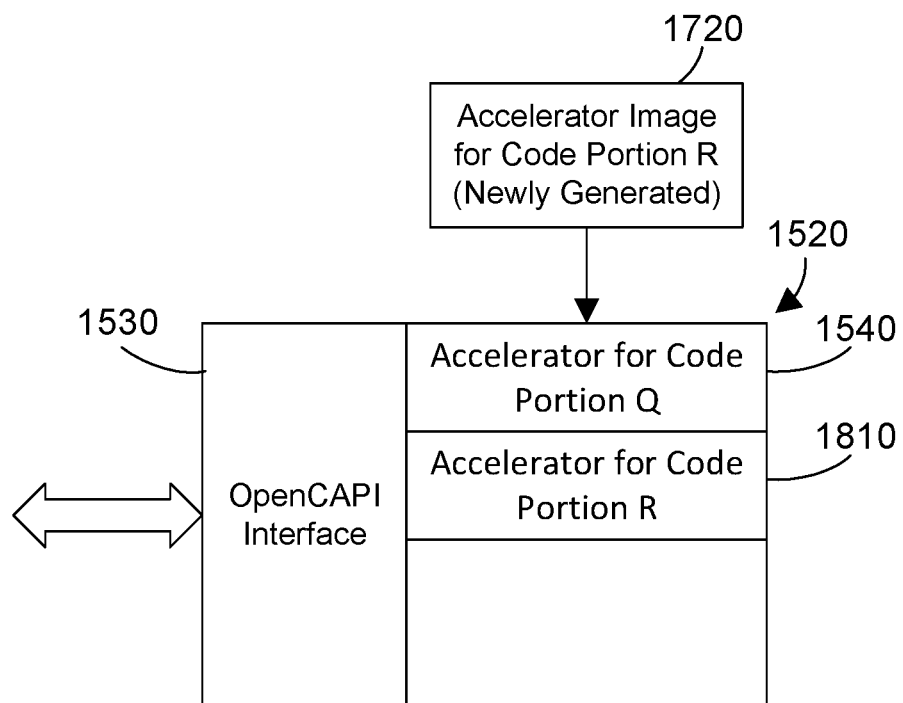
FIG. 18 is a block diagram showing the deployment of a newly-generated accelerator image for code portion R to a programmable device.
Figures 19, 20:
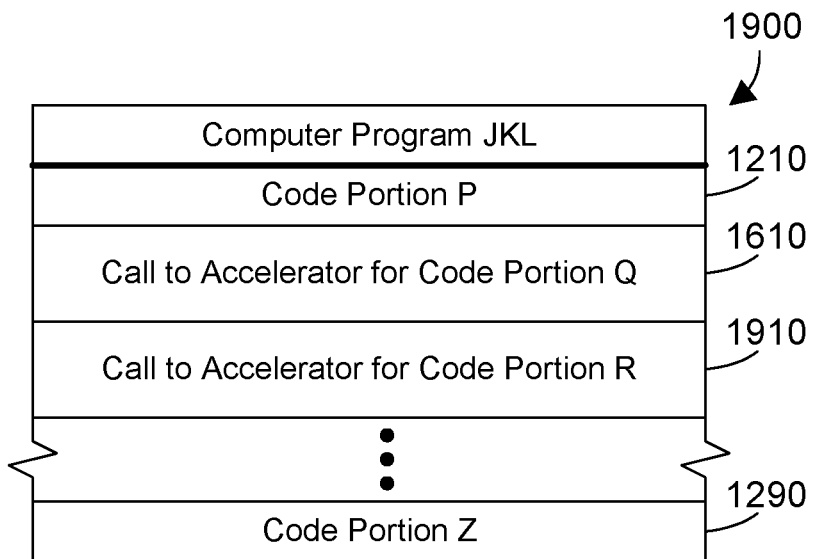
FIG. 19 is a is a block diagram showing the computer program in FIG. 16 after code portion R has been replaced with a call to the accelerator for code portion R.
FIG. 20 is a block diagram of the accelerator catalog 1400 shown in FIG. 14 after an entry is created representing the accelerator for code portion R.

There is still an identified code portion (step 1180=YES), namely code portion R shown in FIG. 13, so method 11 in FIG. 11 loops back to step 1140, where code portion R 1230 is selected (step 1140). There is no previously-generated accelerator in the catalog 1400 shown in FIG. 14 for code portion R (step 1150=NO), so an accelerator image is dynamically generated for code portion R (step 1170). This is represented in FIG. 17, where the code portion R 1230 is used to generate HDL for code portion R 1710, which is used to generate the accelerator image for code portion R 1720. The accelerator image for code portion R 1720, which was newly dynamically generated, is then deployed to the programmable device (step 1172). This is shown in FIG. 18, where the programmable device 1520 that already includes accelerator for code portion Q 1540 is loaded with the accelerator image for code portion R 1720 to generate the accelerator for code portion R 1810. The computer program is then revised to replace code portion R with the call to the accelerator for code portion R (step 1174), as shown at 1910 in FIG. 19. The accelerator for code portion R is also stored in the accelerator catalog (step 1176), resulting in the accelerator catalog 1400 containing entries AccQ and AccR corresponding to two accelerators, as shown in FIG. 20.

Figure 21:
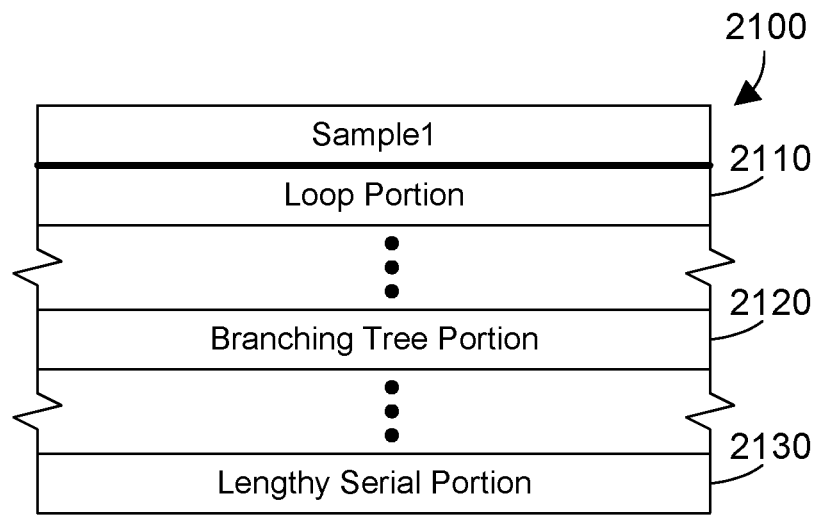
FIG. 21 is a block diagram of a sample computer program.
Figure 22:
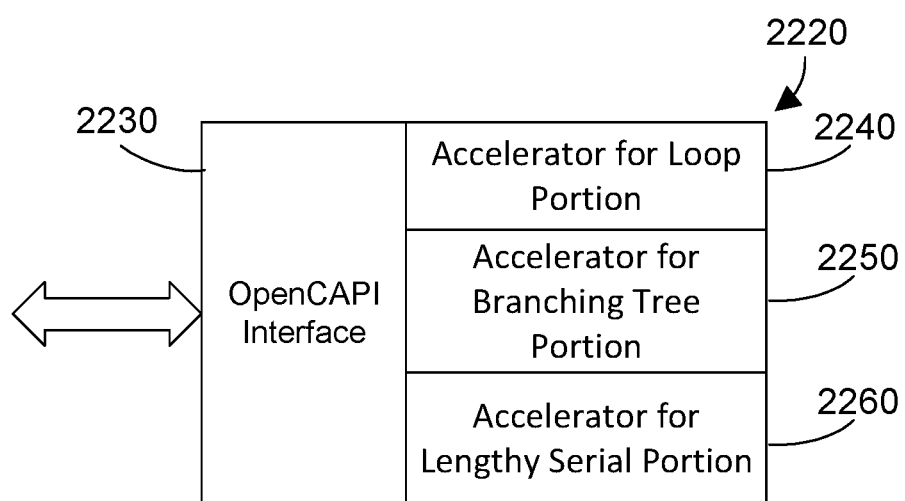
FIG. 22 is a block diagram of a programmable device that has an OpenCAPI interface and includes an accelerator for the loop portion in FIG. 21, an accelerator for branching tree portion in FIG. 21, and an accelerator for lengthy serial portion in FIG. 21.

A more specific example is shown in FIGS. 21 and 22. For this example we assume a computer program called Sample1 2100 includes three different code portions of interest, namely a loop portion 2110, a branching tree portion 2120, and a lengthy serial portion 2130. Loop portion 2110 is representative of a code portion that is a loop that can be unrolled because each iteration is largely independent from other iterations. Due to the independence of each iteration, the loop can be unrolled, and the loop function can be deployed to an accelerator so each iteration will run in parallel in hardware. Financial risk calculations sometimes include code portions such as loop portion 2110. Running different iterations of the loop in parallel in a hardware accelerator increases the run-time performance of the Sample1 computer program.

Computer program Sample1 2100 also includes a branching tree portion 2120. We assume for this example branching tree portion 2120 operates on one or more relatively deep branching trees. In this case, the branching tree portion 2120 can be deployed to an accelerator so each branch of the branching tree will run in parallel in hardware, the branch selection criteria will be calculated, and at the final stage of the logic, the result will be selected from the selected branch. Running different branches of the branching tree in parallel in a hardware accelerator increases the run-time performance of the Sample1 computer program.

Computer program Sample1 2100 also includes a lengthy serial portion 2130. We assume for this example the lengthy serial portion 2130 can be shortened by leveraging unique hardware capabilities in an accelerator. Some math functions, for example, could by lengthy serial portions that could be implemented in an accelerator. Running a lengthy serial portion in hardware increases the run-time performance of the Sample1 computer program.

We assume the code portions in FIG. 21 are identified according to profile data 520 generated by the code profiler 510 in FIG. 5. The criteria used by the code selection tool 530 to select the code portions 2110, 2120 and 2130, which are examples of code portion 326 in FIGS. 4 and 5, may be any suitable criteria. The three example code portions 2110, 2120 and 2130 in FIG. 21 as described above indicate suitable criteria that could be used by the code selection tool 530 to select code portions 2110, 2120 and 2130 to be implemented in one or more accelerators. Of course, the claims and disclosure herein expressly extend to any suitable criteria for the code selection tool 530 to select one or more code portions to be implemented in one or more accelerators.

FIG. 22 shows a programmable device 2220 that has an OpenCAPI interface 2230 and includes an accelerator for loop portion 2240, an accelerator for branching tree portion 2250, and an accelerator for lengthy serial portion 2260. While these three accelerators are shown to be implemented in the same programmable device 2220 in FIG. 22, one skilled in the art will recognize these could be implemented in separate programmable devices as well.

Figure 23:
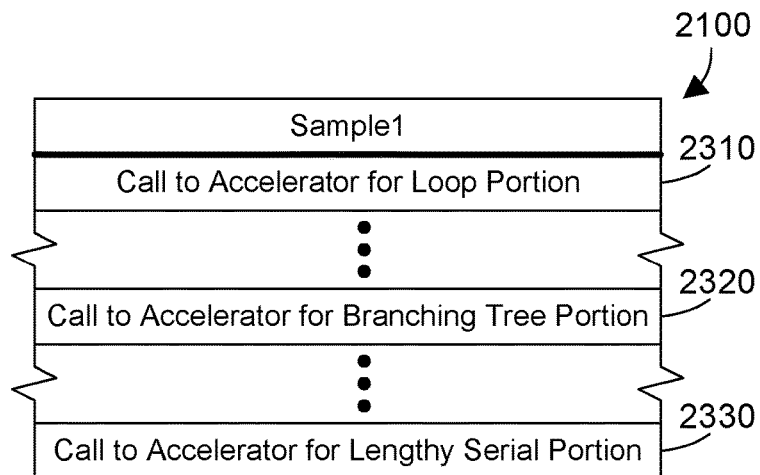
FIG. 23 is a block diagram of the computer program in FIG. 21 after the code portions have been replaced with calls to corresponding accelerators.

FIG. 23 shows the computer program Sample1 2100 after the code portions shown in FIG. 21 are replaced with calls to the hardware accelerators shown in FIG. 22. Thus, loop portion 2110 in FIG. 21 has been replaced by a call to the accelerator for loop portion 2310; the branching tree portion 2320 in FIG. 21 has been replaced by a call to the accelerator for the branching tree portion 2320; and the lengthy serial portion 2130 in FIG. 21 has been replaced by a call to the accelerator for the lengthy serial portion 2330. Because the Sample1 computer program 2100 in FIG. 23 now includes calls to hardware accelerators, the run-time performance of the computer program 2100 is increased.

Figure 24:
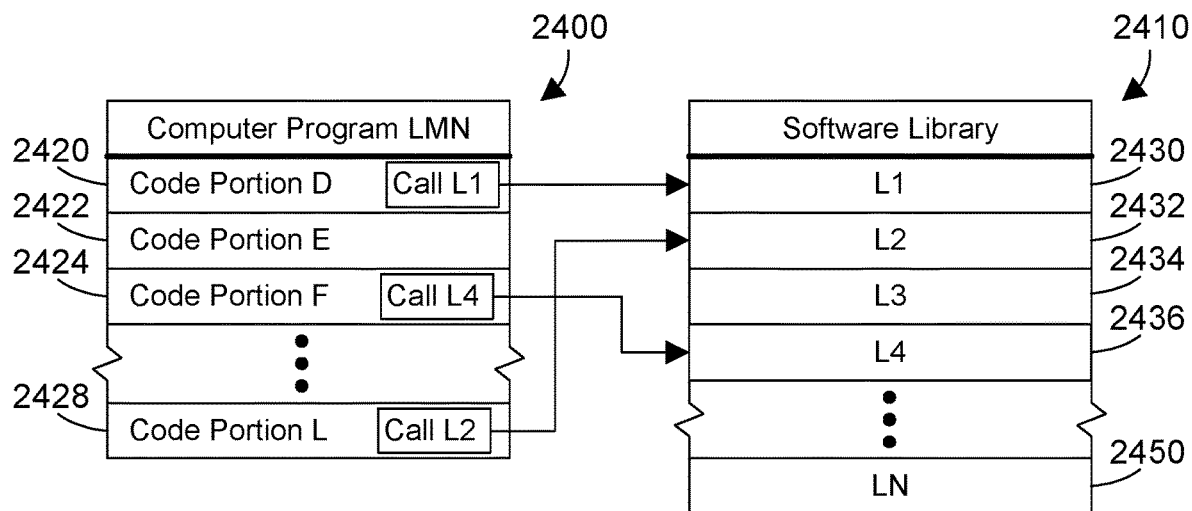
FIG. 24 is a block diagram of a prior art computer program that calls functions in a software library.

FIG. 24 shows a prior art computer program 2400 that includes calls to functions in a software library 2410. Software libraries are very well-known in the art, and provide common functions that programmers can use instead of having to code these common functions. For example, functions that perform compression, graphics operations and XML parsing could be included in a software library. The computer program 2400 includes code portion D 2420, code portion E 2422, code portion F 2424, possibly other code portions not shown, through code portion L 2428. Software library 2410 includes functions L1 2430, L2 2432, L3 2434, L4 2436, possibly other functions, through LN 2450. Code portion D 2420 in computer program 2400 includes a call to function L1 2430 in software library 2410. Code portion F 2424 includes a call to function L4 2436 in software library 2410. Code portion L 2428 includes a call to function L2 2432 in software library 2410.

Figure 25:
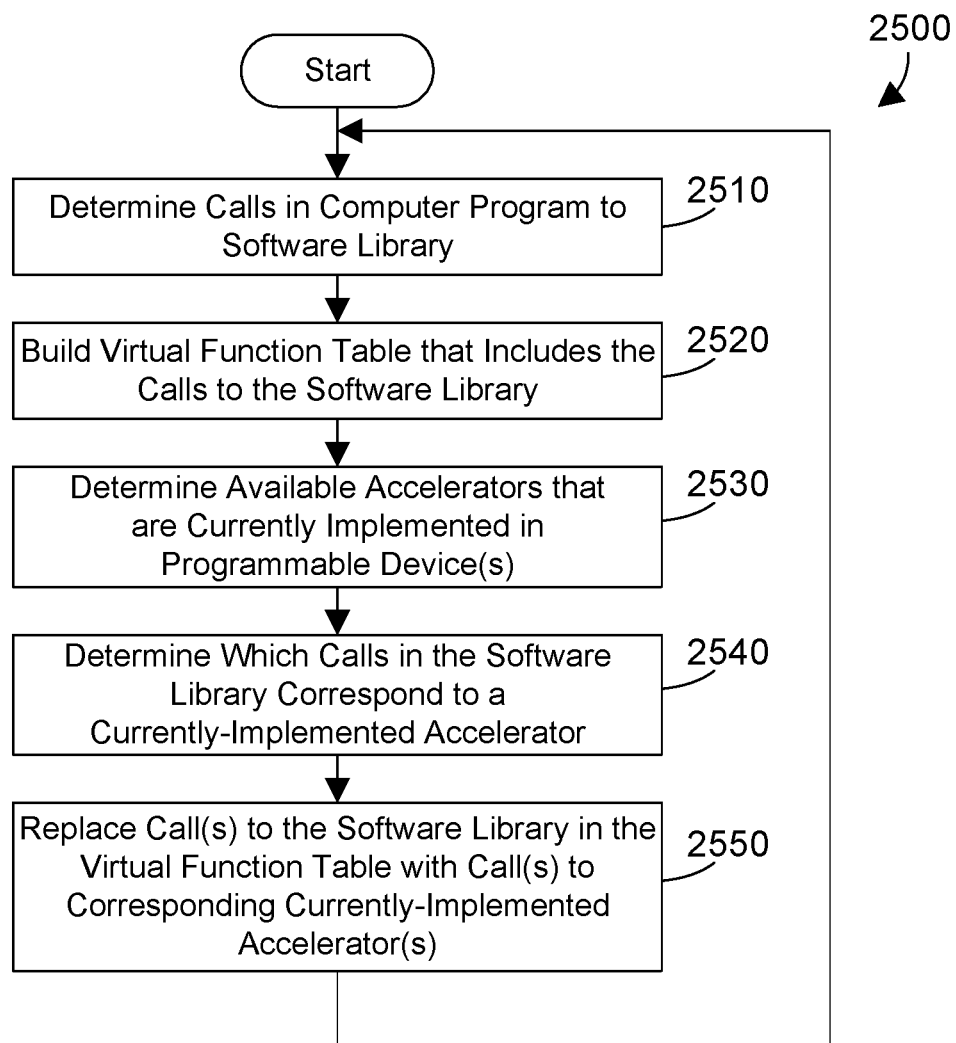
FIG. 25 is a flow diagram of a method for replacing calls to the software library with corresponding calls to one or more currently-implemented accelerators.

Referring to FIG. 25, a method 2500 is preferably performed by the accelerator deployment tool 324 in FIG. 3. Calls in the computer program to the software library are determined (step 2510). A virtual function table is built that includes the calls to the software library (step 2520). The available accelerators that are currently implemented in one or more programmable devices are determined (step 2530). Calls in the software library that correspond to a currently-implemented accelerator are determined (step 2540). One or more function calls to the software library in the virtual function table are then replaced with one or more corresponding calls to a corresponding currently-implemented accelerator (step 2550). Note that method 2500 then loops back to step 2510, indicating this method can continuously performs its functions as accelerators are deployed or removed.

One specific implementation of a virtual function table is shown at 2600 in FIG. 26. The virtual function table 2600 lists calls from the computer program that were previously made directly to the software library, and creates a level of indirection so those calls can be made to an accelerator instead when possible. The calls in the computer program 2400 in FIG. 24 have been replaced by calls to the functions in the virtual function table 2600, as shown in computer program 2700 in FIG. 27. Thus, the call to L1 is replaced with a call to F1; the call to L4 is replaced with a call to F4; and the call to L2 is replaced with a call to F2. The virtual function table 2600 indicates which functions to call for each call from the computer program. When the virtual function table is initially built, each call from the computer program is mapped to the corresponding call to the software library. The modified computer program 2700 and virtual function table 2600 thus provide similar functionality as shown in FIG. 24, but with a level of indirection. Thus, code portion D 2720 calls function F1 in the virtual function table 2600, which generates a call to L1 in the software library. Code portion F 2724 calls function F4 in the virtual function table 2600, which generates a call to L4 in the software library. Code portion L 2728 calls function F2 in the virtual function table, which generates a call to L2 is the software library. We see from this simple example that when the virtual function table is initially built, it provides similar function as shown in FIG. 24, namely, each call to the virtual function table results in a corresponding call to the software library.

FIG. 28 shows an accelerator correlation table 2800. We assume for this example that three accelerators have been deployed, namely Acc1, Acc2 and Acc3. We assume these accelerators correspond to three functions in the software library. Thus, Acc1 corresponds to library function L4; Acc2 corresponds to library function L1; and Acc3 corresponds to library function L2, as indicated in FIG. 28. The correlation between the accelerators and library functions can be determined in any suitable way, including a user manually generating entries to the accelerator correlation table, or the accelerator deployment tool automatically determining the correlation between accelerators and library functions. For accelerators manually generated by a user, the user could use the same library name and function names, thus allowing a code linker to automatically detect the accelerator and create the call to the accelerator instead of to the software library. Similarly, automatically-generated accelerators could use the same library name and function names, allowing the code linker to function in similar fashion to automatically detect the accelerator and create the call to the accelerator instead of to the software library. In a different implementation the accelerator could include data that characterizes its functions, thereby allowing the accelerator to be queried to determine the functions it supports, which information could be used to replace calls to the software library with calls to the accelerator instead.

Figures 29, 30:
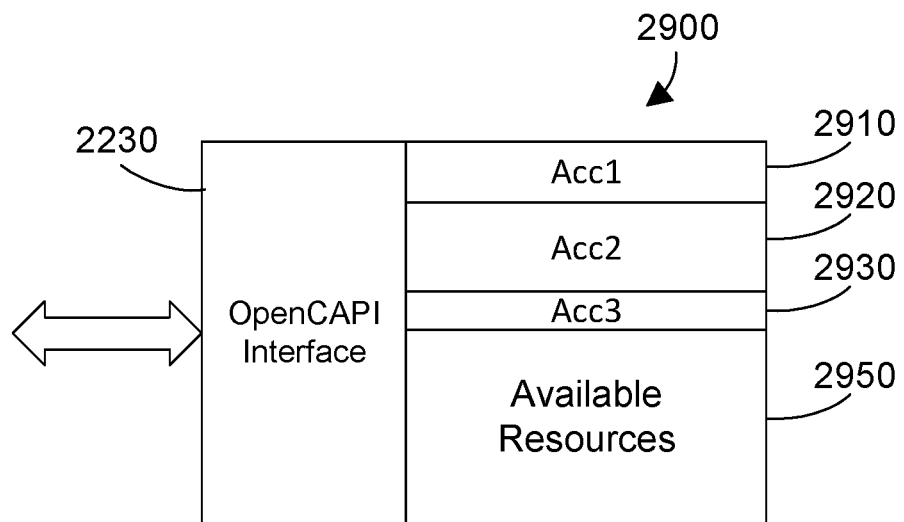
FIG. 29 is a block diagram of a programmable device showing the three currently-implemented accelerators listed in the table in FIG. 28.
FIG. 30 shows the virtual function table in FIG. 26 after calls to the software library have been replaced with calls to corresponding accelerators.

FIG. 29 shows a programmable device 2900 that includes an OpenCAPI interface 2230 and the three accelerators Acc1, Acc2 and Acc3 referenced in FIG. 28. These three accelerators 2910, 2920 and 2930 are currently-implemented accelerators because they already exist in the programmable device 2900. FIG. 29 also shows available resources 2950 on the programmable device 2900 that have not yet been used.

We now consider method 2500 in FIG. 25 with respect to the specific example in FIGS. 26-29. Steps 2510 and 2520 build the virtual function table 2600 in FIG. 26. Step 2530 determines Acc1 2910, Acc2 2920 and Acc3 2930 are currently implemented in a programmable device 2900 and are available for use. Step 2540 reads the accelerator correlation table 2800 to determine that Acc1 corresponds to library function L4; Acc2 corresponds to library function L1; and Acc3 corresponds to library function L2. As discussed above, these library functions could be functions that perform compression, graphics operations, XML parsing, or any other suitable library functions. Step 2550 then replaces calls to the software library in the virtual function table with calls to the currently-implemented accelerators, as shown in the virtual function table 2600 in FIG. 30. The virtual function table thus provides a level of indirection that allows dynamically replacing a call to the software library with a call to an accelerator without the computer program being aware the software library function has been implemented in an accelerator. The result is improved run-time performance of the computer program in a way that is transparent to the computer program.

Figure 31:
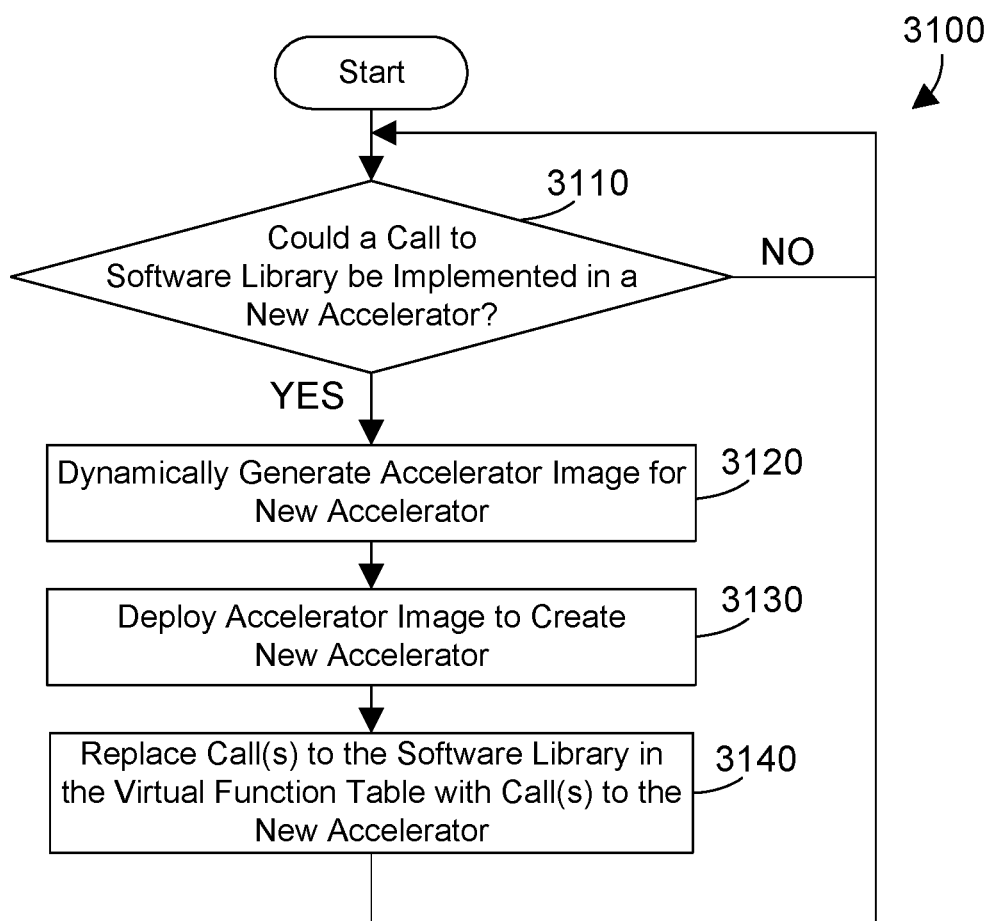
FIG. 31 is a flow diagram of a method for generating a new accelerator and replacing one or more calls to the software library with one or more corresponding calls to the new accelerator.

In an alternative embodiment, not only can currently-implemented accelerators be used to replace calls to software library functions, but a new accelerator can be dynamically generated to replace a call to a software library function as well. Referring to FIG. 31, when a call to the software library cannot be implemented in a new accelerator (step 3110=NO), method 3100 loops back to step 3110 and continues until a call to the software library could be implemented in a new accelerator (step 3110=YES). One factor that comes into play in deciding whether a call to the software library could be implemented in a new accelerator is the available resources on one or more programmable devices. For example, if the available resources 2950 in FIG. 29 provide sufficient resources for implementing a call to the software library in a new accelerator that could be deployed to the available resources 2950, step 3110 could be YES. An accelerator image for the new accelerator is dynamically generated (step 3120). One suitable way to dynamically generate a new accelerator image is using the process in FIG. 4 discussed in detail above. Of course, other ways to dynamically generate an accelerator image are also within the scope of the disclosure and claims herein. The accelerator image dynamically generated in step 3120 is then deployed to a programmable device to create the new accelerator (step 3130). One or more calls to the software library in the virtual function table are replaced with corresponding one or more calls to the new accelerator (step 3140). Method 3100 then loops back to step 3110 and continues, indicating method 3100 can continuously monitor and function to create new accelerators, as needed.

Figures 32, 33:
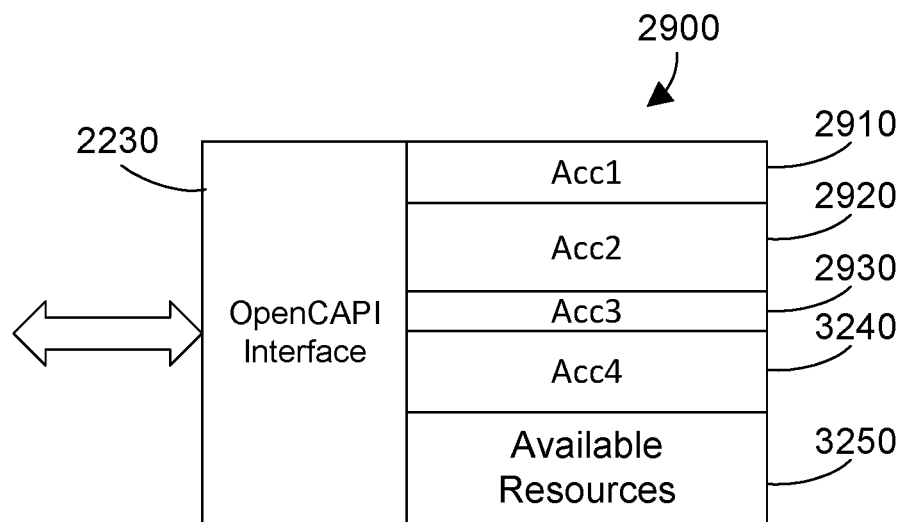
FIG. 32 is a block diagram of a programmable device showing the three previously-generated accelerators and the one new accelerator generated in FIG. 31.
FIG. 33 shows the virtual function table in FIGS. 26 and 30 after calls to the software library have been replaced with corresponding calls to the new accelerator.

We continue with the same example in FIGS. 26-30 in discussing method 3100 in FIG. 31. We assume for this specific example that step 3110 determines the call to L3 in the software library could be implemented in a new accelerator (step 3110=YES). We assume an accelerator image for the new accelerator called Acc4 is generated in step 3120, then deployed to a programmable device in step 3130. We assume the image for Acc4 is deployed to the same programmable device 2900 shown in FIG. 29, resulting in the programmable device 2900 including Acc1 2910, Acc2 2920, Acc3 2930, and Acc4 3240, as shown in FIG. 32. Note the available resources 3250 are less than in FIG. 29 because Acc4 has used some of those resources. Step 3140 in FIG. 31 then replaces the call to L3 in the virtual function table with a call to Acc4, as shown in FIG. 33. At this point, when the computer program calls function F3 in the virtual function table 2600, Acc4 will be called to perform this function instead of performing the function via a call to the software library.

Figure 34:
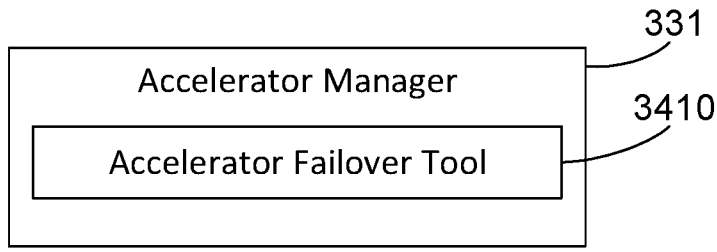
FIG. 34 is a block diagram showing an accelerator failover tool in the accelerator manager of FIG. 3.
Figure 35:
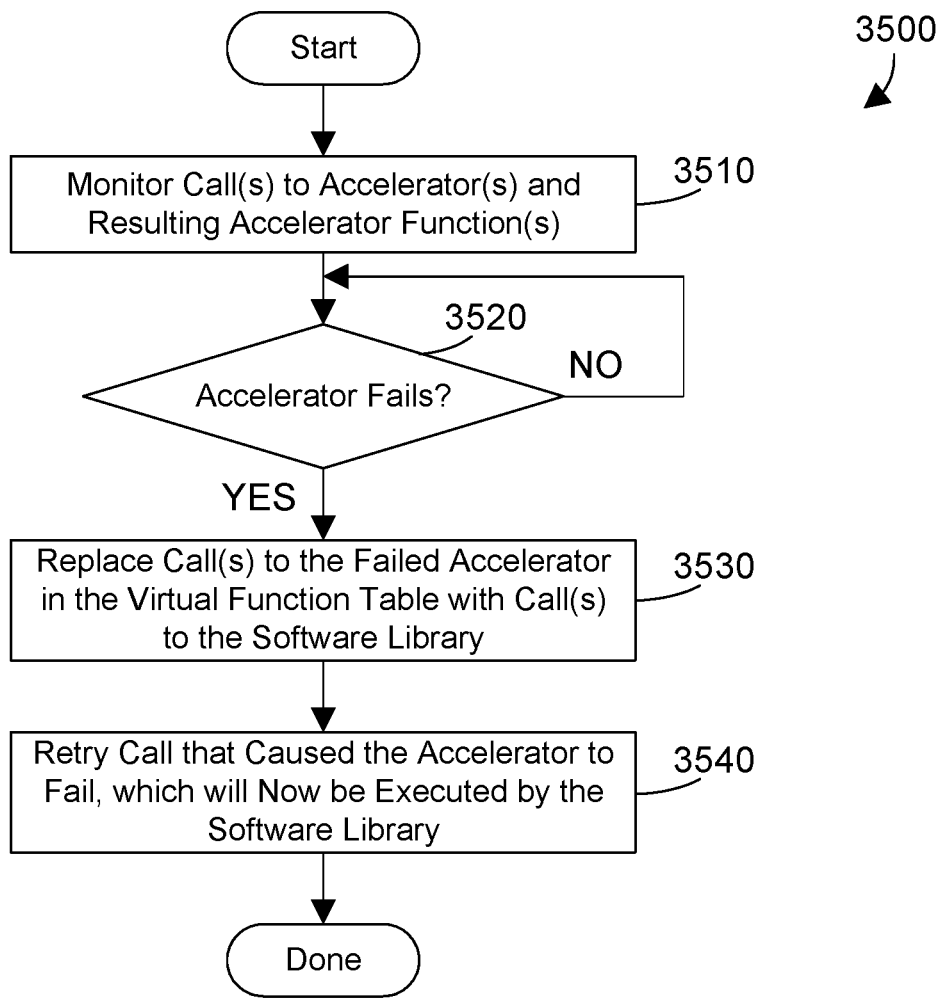
FIG. 35 is a flow diagram of a method for recovering from an accelerator failure.

The accelerator manager 331 in FIG. 3 is shown in FIG. 34 to include an accelerator failover tool 3410 that monitors accelerators and takes corrective action when a failure in an accelerator is detected. Method 3500 in FIG. 35 represents steps that are preferably performed by the accelerator failover tool 3410, which is preferably part of the accelerator manager 331 but could be separate as well. Calls to accelerators and the resulting accelerator functions are monitored (step 3510). When there is no failure in an accelerator (step 3520=NO), method 3520 loops back and continues monitoring for failures. When an accelerator fails (step 3520=YES), one or more calls to the failed accelerator in the virtual function table are replaced with one or more corresponding calls to the software library (step 3530). The call that caused the accelerator to fail is then retried, which will now be executed by the software library instead of the accelerator (step 3540). Method 3500 is then done.

The accelerator failover tool 3410 can detect a failure in an accelerator in any suitable way. Two specific ways are disclosed herein by way of example. Method 3600 in FIG. 36 starts with a call to an accelerator (step 3610). The accelerator progress is monitored (step 3620). When the accelerator successfully completes the call (step 3630=YES), method 3600 is done. When the accelerator does not successfully complete the call (step 3630=NO), the accelerator provides an error signal to the accelerator manager (step 3640). Method 3600 is then done. By providing an explicit error signal by the accelerator to the accelerator manager, the accelerator itself can inform the accelerator manager when a failure occurs.

Figure 36:
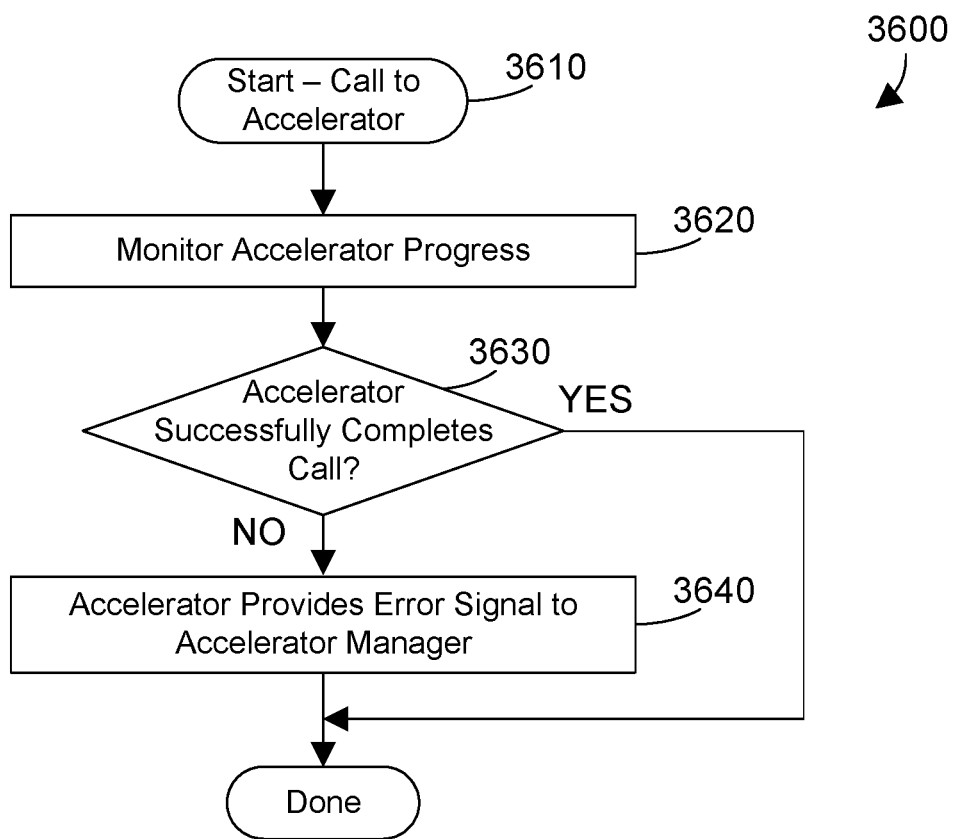
FIG. 36 is a flow diagram of one suitable method for determining when an accelerator fails.
Figures 37, 38:
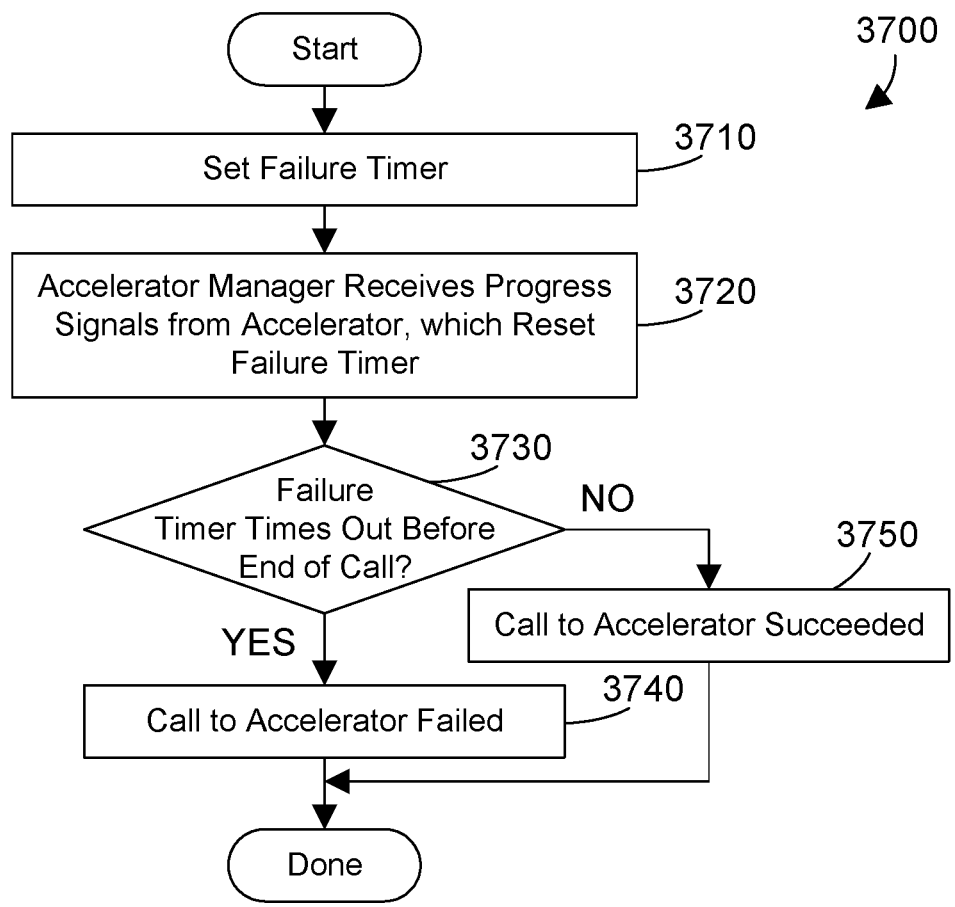
FIG. 37 is a flow diagram of one suitable method for monitoring accelerator progress.
FIG. 38 is a block diagram of the virtual function table shown in FIG. 33 after Acc3 fails and is replaced by a call to the software library.

In some cases, the failure of an accelerator may affect its ability to generate an error signal in step 3640 in FIG. 36. An alternative method 3700 in FIG. 37 is shown that does not require an error signal from the accelerator. A failure timer is set (step 3710) when an accelerator begins processing. The failure timer could be set, for example, by the accelerator manager detecting a call to an accelerator by a computer program. The accelerator manager receives one or more progress signals from the accelerator, which reset the failure timer (step 3720). The value the failure timer is initially set in step 3710 to a value that is high enough that normal function of the accelerator without any failure will cause the progress signals from the accelerator in step 3720 to reset the failure timer before it times out. For example, the accelerator could provide a heartbeat signal at a set interval to indicate it is still alive and well. The failure timer could be set to a value much larger than the heartbeat interval, such as an order of magnitude higher, so that normal operation of the accelerator without any failure will result in the timer being reset before it ever times out. When the failure timer times out before the end of the call (step 3730=YES), meaning before the accelerator is finished processing the call, the call to the accelerator failed (step 3740). When the failure timer does not time out before the end of the call (step 3730=NO), the call to the accelerator succeeded (step 3730). Method 3700 is then done.

A simple example is now provided to illustrate the concepts discussed above. We start with the virtual function table 2600 as shown in FIG. 33, where a call to function F1 results in a call to accelerator Acc2, a call to function F2 results in a call to accelerator Acc3, a call to function F3 results in a call to accelerator Acc4, and a call to function F4 results in a call to accelerator Acc1. We assume for this example a computer program calls function F2, which results in a call to accelerator Acc3. We further assume accelerator Acc3 fails as a result of performing the needed processing for function F2. Referring to FIG. 35, the accelerator manager monitors the call to Acc3 (step 3510), and detects that Acc3 fails (step 3520=YES). As a result of detecting the failure in step 3520, the accelerator manager replaces all calls to Acc3 in the virtual function table with a corresponding call to the software library (step 3530). The accelerator manager reads the accelerator correlation table 2800 in FIG. 28 and determines that library function L2 corresponds to accelerator Acc3. The accelerator manager then replaces the calls to Acc3 in the virtual function table 2600 with calls to L2 in the software library instead. The resulting virtual function table 2600 is shown in FIG. 38, where a call to F2 will now result in a call to L2, which is a function in the software library, instead of to Acc3. The accelerator manager can then retry the call to F2 (step 3540), which will now result in function L2 in the software library being called instead of calling Acc3.

The accelerators shown in FIGS. 8, 15, 22, 29 and 32 include an OpenCAPI interface. Note, however, the Open-CAPI interface is not strictly necessary to dynamically generate and deploy an accelerator as disclosed and claimed herein. Deploying an accelerator to a programmable device that includes an OpenCAPI interface is useful because the OpenCAPI specification is open, allowing anyone to develop to the specification and interoperate in a cloud environment. In addition, the OpenCAPI interface provides lower latency, reducing the "distance" between an accelerator and the data it may consume or produce. Furthermore, OpenCAPI provides higher bandwidth, increasing the amount of data an accelerator can consume or produce in a given time. These advantages of OpenCAPI combine to provide a good environment for implementing a code portion of a computer program in an accelerator, and to lower the threshold for a code portion to be better in an accelerator than in the computer program. However, the disclosure and claims herein apply equally to accelerators that do not include or have access to an OpenCAPI interface.

An accelerator manager monitors hardware accelerators that are called by one or more computer programs. A virtual function table includes multiple entries, where each entry correlates a call from a computer program to a corresponding call to either a software library or a hardware accelerator. A call by the computer program to a function in the virtual function table results in the call being routed to either the software library or to a hardware accelerator depending on the contents of the corresponding entry in the virtual function table. The accelerator manager, in response to a detected failure in an accelerator, replaces one or more calls in the virtual function table to the failed accelerator with calls to the software library. The accelerator manager can then retry the call that caused the accelerator to fail, which will then be executed by the software library.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An apparatus comprising:
   at least one processor;
   a memory coupled to the at least one processor;
   a programmable device coupled to the at least one processor that includes a hardware accelerator;
   a computer program residing in the memory and executed by the at least one processor;
   a software library residing in the memory that includes a plurality of functions;
   a virtual function table that includes a plurality of entries, wherein each of the plurality of entries correlates a call from the computer program to a corresponding call to one of the software library and the hardware accelerator; and
   an accelerator manager residing in the memory and executed by the at least one processor, and in response to a detected failure in the hardware accelerator during a first call by the computer program to a first function in a first entry in the virtual function table that specifies a call to the hardware accelerator, the accelerator manager replaces the call to the hardware accelerator in the first entry of the virtual function table with a call to the software library.

2. The apparatus of claim 1 wherein the accelerator manager monitors calls to the hardware accelerator by the computer program.

3. The apparatus of claim 1 wherein the accelerator manager detects the detected failure.

4. The apparatus of claim 3 wherein the accelerator manager detects the detected failure by receiving an error signal from the hardware accelerator.

5. The apparatus of claim 3 wherein the accelerator manager detects the detected failure by:
   setting a failure timer;
   receiving a plurality of progress signals from the hardware accelerator that each resets the failure timer;
   wherein the accelerator manager detects the failure in the hardware accelerator by detecting a timeout of the failure timer before completion of the call by the hardware accelerator.

6. The apparatus of claim 1 wherein the programmable device comprises an Open Coherent Accelerator Processor Interface (OpenCAPI) coupled to the at least one processor.

7. The apparatus of claim 1 wherein the programmable device comprises a field-programmable gate array (FPGA).

8. The apparatus of claim 1 wherein the accelerator manager, after replacing the call to the hardware accelerator in the first entry of the virtual function table with the call to the software library, retries the first call to the first function in the first entry in the virtual function table, resulting in calling the call to the software library.

9. An apparatus comprising:
   at least one processor;
   a memory coupled to the at least one processor;
   a field-programmable gate array (FPGA) coupled to the at least one processor that comprises an Open Coherent Accelerator Processor Interface (OpenCAPI) coupled to the at least one processor, wherein the FPGA includes a hardware accelerator;
   a computer program residing in the memory and executed by the at least one processor;
   a software library residing in the memory that includes a plurality of functions;
   a virtual function table that includes a plurality of entries, wherein each of the plurality of entries correlates a call from the computer program to a corresponding call to one of the software library and the hardware accelerator; and
   an accelerator manager residing in the memory and executed by the at least one processor, the accelerator manager monitoring calls to the hardware accelerator by the computer program, detecting a failure in the hardware accelerator during a first call by the computer program to a first function in a first entry in the virtual function table that specifies a call to the hardware accelerator by receiving an error signal from the hardware accelerator, and in response to detecting the failure, replaces the call to the hardware accelerator in the first entry of the virtual function table with a call to the software library and retries the first call by the computer program to the first function in the first entry in the virtual function table, resulting in calling the call to the software library.

10. A method for managing failures in hardware accelerators, the method comprising:
    providing a hardware accelerator in a programmable device by programming the programmable device with an accelerator image corresponding to the hardware accelerator;
    providing a software library that includes a plurality of functions;
    providing a virtual function table that includes a plurality of entries, wherein each of the plurality of entries correlates a call from a computer program to a corresponding call to one of the software library and the hardware accelerator;
    executing the computer program;

monitoring calls to the hardware accelerator by the computer program;

detecting a failure in the hardware accelerator during a first call by the computer program to a first function in a first entry in the virtual function table that specifies a call to the hardware accelerator; and in response to detecting the failure, replacing the call to the hardware accelerator in the first entry of the virtual function table with a call to the software library.

11. The method of claim 10 wherein detecting a failure in the hardware accelerator comprises receiving an error signal from the hardware accelerator.

12. The method of claim 10 wherein detecting a failure in the hardware accelerator comprises:

setting a failure timer;

receiving a plurality of progress signals from the hardware accelerator that each resets the failure timer; and detecting a timeout of the failure timer before completion of the call by the hardware accelerator.

13. The method of claim 10 wherein the programmable device comprises an Open Coherent Accelerator Processor Interface (OpenCAPI) coupled to the at least one processor.

14. The method of claim 10 wherein the programmable device comprises a field-programmable gate array (FPGA).

15. The method of claim 10 further comprising:

after replacing the call to the hardware accelerator in the first entry of the virtual function table with the call to the software library, retrying the first call to the first function in the first entry in the virtual function table, resulting in calling the call to the software library.

* * * * *